(12) United States Patent
Maeda et al.

(10) Patent No.: US 6,853,324 B2
(45) Date of Patent: Feb. 8, 2005

(54) DIGITAL-TO-ANALOG CONVERSION CIRCUIT AND IMAGE DISPLAY APPARATUS USING THE SAME

(75) Inventors: Kazuhiro Maeda, Nara (JP); Yasushi Kubota, Sakurai (JP); Hajime Washio, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/952,183

(22) Filed: Sep. 13, 2001

(65) Prior Publication Data

US 2002/0060636 A1 May 23, 2002

(30) Foreign Application Priority Data

Sep. 14, 2000 (JP) ........................................ 2000-279810

(51) Int. Cl.[7] .............................................. H03M 1/66
(52) U.S. Cl. ........................ 341/150; 341/144; 341/172
(58) Field of Search ............................... 341/144, 150, 341/172; 257/368, 391, 392, 401

(56) References Cited

U.S. PATENT DOCUMENTS

| | | | | | |
|---|---|---|---|---|---|
| 4,476,456 A | * | 10/1984 | Domogalla | ................. | 341/118 |
| 4,661,802 A | * | 4/1987 | Yukawa | ....................... | 327/408 |
| 4,667,179 A | * | 5/1987 | Law et al. | .................. | 341/150 |
| 4,803,462 A | * | 2/1989 | Hester et al. | ............... | 341/172 |
| 4,831,381 A | * | 5/1989 | Hester | ......................... | 341/172 |
| 5,130,571 A | * | 7/1992 | Carroll | ......................... | 327/94 |
| 5,332,997 A | * | 7/1994 | Dingwall et al. | ........... | 341/136 |
| 5,534,819 A | * | 7/1996 | Gunter et al. | ............... | 327/553 |
| 5,581,252 A | * | 12/1996 | Thomas | ....................... | 341/144 |
| 5,625,361 A | * | 4/1997 | Garrity et al. | .............. | 341/172 |
| 5,867,138 A | * | 2/1999 | Moon | ........................... | 345/92 |
| 5,894,281 A | * | 4/1999 | Toda | .......................... | 341/154 |
| 6,157,334 A | * | 12/2000 | Kimura | ...................... | 341/144 |

FOREIGN PATENT DOCUMENTS

| | | | | |
|---|---|---|---|---|
| JP | A-64-046383 | 2/1989 | | |
| JP | 04-003522 | 1/1992 | | |
| JP | 404003522 A | * 1/1992 | ................ | 341/144 |
| JP | A-05-315959 | 11/1993 | | |
| JP | A-11-046142 | 2/1999 | | |
| TW | 402846 | 8/2000 | | |

* cited by examiner

*Primary Examiner*—Michael Tokar
*Assistant Examiner*—Khai Nguyen
(74) *Attorney, Agent, or Firm*—David G. Conlin; William J. Daley, Jr.; Edwards & Angell, LLP

(57) ABSTRACT

A digital-to-analog conversion circuit of charge distribution type includes a plurality of capacitors having respective capacitances that increase in a sequential order, one end of the capacitors being commonly connected electrically. The circuit also includes a plurality of analog switches each for electrically connecting a reference potential corresponding to a digital signal inputted from outside to the other end of the corresponding capacitor. These analog switches have respective driving capacities that increase in a sequential order.

26 Claims, 21 Drawing Sheets

DIGITAL-TO-ANALOG CONVERSION CIRCUIT AND IMAGE DISPLAY APPARATUS USING THE SAME

BACKGROUND OF THE INVENTION

The present invention relates to a digital-to-analog conversion circuit converting a digital amount into an analog amount and an image display apparatus displaying an image based on a digital image signal by using the digital-to-analog conversion circuit.

One of known image display apparatuses using a digital-to-analog conversion circuit is an image display apparatus of active matrix type using liquid crystal, the structure of which is schematically shown in FIG. 20. As shown in FIG. 20, the image display apparatus includes a pixel array PIXARY consisting of a plurality of pixels PIX arrayed in a matrix form, a scanning signal line driving circuit GD, a data signal line driving circuit SD, a plurality of scanning signal lines GL1–GLy extending along rows of the pixels PIX, and a plurality of data signal lines SL1–SLx extending along columns of the pixels PIX. The data signal line driving circuit SD samples a digital signal DAT, which is digital image data inputted thereto, in synchronization with timing signals such as a clock signal CKS and a start signal SPS generated by a control signal generator CTB. Then the circuit SD amplifies the sampled digital signal DAT as necessary, and outputs a data signal, which is analog image data, to each of the data signal lines SL1–SLx. The scanning signal line driving circuit GD selects the scanning signal lines GL1–GLy sequentially in synchronization with a timing signal such as a clock signal CKG generated by the control signal generator CTB to turn on and off switching elements provided in the respective pixels PIX. The data signal outputted to each of the data signal lines SL1–SLx is thereby written to the pixels PIX. A capacitor provided in each pixel PIX holds the written data signal.

Hitherto, the data signal line driving circuit SD and the scanning signal line driving circuit GD have generally been provided as external ICs separate from an insulation substrate on which the pixel array PIXARY is formed. In recent years, to reduce the assembling cost and improve reliability in assembling, a technique of forming all of the pixel array, the data signal line driving circuit, and scanning signal line monolithically on the insulation substrate has been reported.

Description will be made on the construction of the data signal line driving circuit of the image display apparatus of active matrix type. The data signal line driving circuit uses a digital-to-analog conversion circuit in which a reference voltage inputted from the outside is applied to a capacitor array through a switching circuit which switches according to whether the inputted digital signal (digital image data) has a high level or a low level, and a charge Q according to the applied voltage is held therein. For the sake of a brief description, suppose that an 8-bit signal is inputted to the data signal line driving circuit.

FIG. 21 shows a fundamental block of the data signal line driving circuit SD. As shown in FIG. 21, for one stage, i.e., for one data signal line SL, the data signal line driving circuit SD includes one scanning circuit SR, a switching circuit SWC performing the switching operation according to the level (high or low) of the input digital signal DAT1–DAT8 and the output from the scanning circuit SR, a capacitor array CAPARY having capacitors C1–C8 having different areas, namely, different capacitances set at the ratio of $2^0:2^1:2^2:2^3:2^4:2^5:2^6:2^7$ in the order of bit position in the input digital signal from the least significant bit (LSB) to the most significant bit (MSB), and an output circuit BUF outputting a data signal to the corresponding data signal line SL, according to a charge amount held by each of the capacitors C1–C8 of the capacitor array CAPARY. The switching circuit SWC, the capacitor array CAPARY, and the output circuit BUF constitutes a digital-to-analog conversion circuit of charge distribution type.

The switching circuit SWC includes NAND circuits (non-conjunction circuits) NAND1–NAND8 to which an output signal of the scanning circuit SR is inputted through one input terminal thereof and the digital signals DAT1–DAT8 are inputted through the other input terminal thereof, and switches SW1–SW8 whose control input terminals are connected to output terminals of the NAND circuits NAND1–NAND8 respectively and whose output terminals are connected to one end of the capacitors C1–C8 respectively. A reference potential V1 for digital-to-analog conversion is connected to one input terminal of each of the switches SW1–SW8. A ground GND is connected to the other input terminal of each of the switches SW1–SW8.

The operation of the data signal line driving circuit SD will be described below.

When both the digital signal DAT1–DAT8 and the output signal of the scanning circuit SR have a high level, the output signal of the corresponding non-conjunction circuit NAND1–NAND8 has a low level. As a result, the associated switch SW1–SW8 is switched to the side of the reference potential V1. Consequently the reference potential V1 is applied to the associated capacitor C1–CB. On the other hand, when the output signal of a non-conjunction circuit NAND1–NAND8 has a high level, the associated switch SW1–SW8 is changed to the side of the ground GND. Consequently the ground GND is connected to the associated capacitor C1–C8.

Supposing that the total of capacitances of those capacitors C1–C8 that are connected to the digital-to-analog conversion reference potential V1 side is Con and that the total of capacitances of those capacitors C1–C8 that are connected to the ground GND side is Coff, a voltage Vout at an output end commonly connected to the capacitors C1–C8 is expressed as follows:

$$Vout = V1 \times Con / (Con + Coff)$$

The output circuit BUF current-amplifies the voltage Vout in synchronization with a transfer signal TRFS and outputs a data signal having a voltage corresponding to the voltage Vout to the corresponding data signal line SL.

The digital-to-analog conversion circuit of charge distribution type for use in the data signal line driving circuit SD executes a digital-to-analog conversion by distributing the charge with the capacitors C1–C8. The capacitances of the capacitors C1–C8 are changed to be increased at the ratio corresponding to the area ratio of $2^0:2^1:2^2:2^3:2^4:2^5:2^6:2^7$ in order of bit position of the input digital signal from the least significant bit to the most significant bit. Accordingly, the driving capacity or ability required for each analog switch SW1–SW8 is different according to an on-state and an off-state of the other analog switches SW1–SW8 of the switching circuit SWC connecting the one end of each of the capacitors C1–C8 to the reference potential V1 or the ground GND. Therefore, it is necessary to give each of the analog switches SW1–SW8 a driving capacity high enough to charge the capacitors C1–C8 within a predetermined digital-to-analog conversion period of time, considering a capacitor connection that provides the largest synthetic capacitance among all possible capacitor connections. Normally, the analog switches SW1–SW8 are constructed of transistors. The driving capacity β of the analog switch SW1–SW8 is expressed as follows:

$$\beta = \mu \times (\in ox \times W)/(Tox \times L)$$

where $\mu$ is the mobility of electrons (holes), $\in ox$ is the dielectric constant of a gate insulation film, Tox is the thickness of the gate insulation film, L is the length of the gate of the transistor, W is the width of the gate of the transistor. The parameters $\mu$, $\in ox$, Tox, and L are uniquely determined according to factors such as a manufacturing process condition, a withstand pressure determined according to the purpose of use of the transistor, and reliability. Accordingly, the driving capacity of the transistor is adjustable according to its gate width W.

In the digital-to-analog conversion circuit, as described above, the transistors constituting the analog switches SW1–SW8 are required to have driving capacity high enough to charge the capacitors C1–C8 within a predetermined digital-to-analog conversion period of time in consideration of such a capacitor connection as can provide the highest synthetic capacitance of all possible capacitor connections. Such driving capacity can be obtained by increasing the gate width W of the transistors. But maximum connection capacitances corresponding to the analog switches SW1–SW8 are much different from one another. There is a big difference between a maximum connection capacitance Cmax corresponding to the switch to be connected to the capacitor having the maximum capacitance and a maximum connection capacitance Cmin corresponding to the switch to be connected to the capacitor having the minimum capacitance.

In the digital-to-analog conversion circuit, all the analog switches SW1–SW8 have the same size. That is, even the analog switch W1 to be connected to the capacitor C1 having the minimum capacitance is given a gate width W equal to that of the analog switch W8 to be connected to the capacitor C8 having the maximum capacitance. It follows that the transistors constituting the analog switch have sizes larger than necessary. Thus the analog switches occupy a large area in the digital-to-analog conversion circuit. Accordingly, in the image display apparatus of active matrix type, the display driving circuit (data signal line driving circuit) which is disposed in the periphery of a display region has a large area. That is, the ratio of the area of the frame to the display region in the image display apparatus is large.

Further in recent years, portable information terminal equipment has come into wide use. Because liquid crystal display apparatuses are thin, there is a growing demand for them as displays for the portable information terminal equipment. The portable information terminal equipment is required to be compact. Therefore, for the image display apparatuses themselves, it is required to reduce the size of the display driving circuit without reducing a display region, namely, to reduce the frame size.

SUMMARY OF THE INVENTION

Therefore, it is an object of the present invention to provide a compact, high-accuracy digital-to-analog conversion circuit having a reduced circuitry size, and an image display apparatus having a small display driving circuit to allow the frame of the image display apparatus to be small without reducing its display region.

In order to accomplish the above object, according to one aspect of the present invention, there is provided a digital-to-analog conversion circuit of charge distribution type comprising:

a plurality of capacitors having respective capacitances that increase in a sequential order, one end of the capacitors being commonly connected electrically; and a plurality of analog switches each for electrically connecting a reference potential corresponding to a digital signal inputted from outside to the other end of the corresponding capacitor, the digital-to-analog conversion circuit outputting an analog signal corresponding to a potential at the commonly connected one end of the capacitors, wherein the plurality of analog switches have respective driving capacities that increase in a sequential order.

With the construction, the driving capacity of each analog switch can be properly set such that each analog switch has only a required driving capacity. Therefore, it is possible to minimize the difference of the set driving capacity from an optimum driving capacity determined from the capacitor charging time and the layout area. Thus it is possible to design circuitry for the digital-to-analog conversion circuit of the present invention more appropriately than the conventional digital-to-analog conversion circuit to reduce the circuitry scale of the digital-to-analog conversion circuit.

In one embodiment, the driving capacities of the analog switches are set according to the capacitances of the corresponding capacitors.

In the embodiment, an analog switch for a high-order bit corresponding to a higher maximum connection capacitance is given a higher driving capacity, whereas an analog switch for a low-order bit corresponding to a lower maximum connection capacitance is given a lower driving capacity. That is, the driving capacity of the analog switch that connects/disconnects the capacitors to/from a reference potential is appropriately set according to the size of the capacitors connected to the analog switch. Thus, in the case where the driving capacity of the analog switch is proportional to its size, it is possible to reduce the occupation area of the digital-to-analog conversion circuit. It is also possible to make time periods required to charge the capacitors to be uniform. Thus it is possible to improve accuracy in digital-to-analog conversion. The effects rendered by the arrangement can be displayed more effectively in a digital-to-analog conversion circuit for a multi-bit digital signal in which there is a big difference between the capacitance of a capacitor for a low-order bit and that of a capacitor for a high-order bit.

In one embodiment, the driving capacity of each analog switch is set according to a maximum connection capacitance of the analog switch at a time of charging the capacitors. The term "maximum connection capacitance" used herein means a maximum synthetic capacitance of the connected capacitors as viewed from the individual analog switches.

In this embodiment as well, the occupation area of the digital-to-analog conversion circuit can be reduced. Also, time periods required to charge the capacitors can be made uniform. Therefore it is possible to improve the digital-to-analog conversion accuracy.

In one embodiment, each of the analog switches may comprise at least one of an N-channel transistor or a P-channel transistor.

The use of at least one of an N-channel transistor or a P-channel transistor allows the integration of the analog switches to be achievable. Therefore it is possible to reduce the size of the digital-to-analog conversion circuit. In addition, by setting the channel type of the transistor according to the relationship between the reference potential inputted from the outside and a gate voltage of the transistor, it is possible to avoid an insufficient charging which occurs owing to the influence of the threshold of the transistor.

The present invention also provides a digital-to-analog conversion circuit of charge distribution type comprising:

a plurality of capacitors having respective capacitances that increase in a sequential order, one end of the capacitors being commonly connected electrically; and a plurality of analog switches each for electrically connecting a reference potential corresponding to a digital signal inputted from outside to the other end of the corresponding capacitor, the digital-to-analog conversion circuit outputting an analog signal corresponding to a potential at the commonly connected one end of the capacitors, wherein each of the analog switches comprises at least one of an N-channel transistor or a P-channel transistor; and gate widths of the transistors vary among the analog switches depending on the capacitances of the capacitors.

With the above arrangement, by sequentially changing the gate widths of each transistor, driving capacities of the transistors are varied such that an analog switch for a high-order bit corresponding to a higher maximum connection capacitance has a higher driving capacity, whereas an analog switch for a low-order bit corresponding to a lower maximum connection capacitance has a lower driving capacity. Accordingly, reduction of the occupation area of the digital-to-analog conversion circuit is achievable. Further because it is also possible to uniform the time periods required to charge the capacitors, it is possible to improve the digital-to-analog conversion accuracy. These effects are demonstrated more effectively in a digital-to-analog conversion circuit for a multi-bit digital signal in which the difference between the capacitance of a capacitor for a low-order bit and that of a capacitor for a high-order bit increases with the number of the bits.

The present invention also provides a digital-to-analog conversion circuit of charge distribution type comprising:

a plurality of capacitors having respective capacitances that are varied to increase in a sequential order, one end of the capacitors being commonly connected electrically; and a plurality of analog switches each for electrically connecting a reference potential corresponding to a digital signal inputted from outside to the other end of the corresponding capacitor, the digital-to-analog conversion circuit outputting an analog signal corresponding to a potential at the commonly connected one end of the capacitors, wherein each of the analog switches consists of a single semiconductor switching element or a plurality of parallel-connected semiconductor switching elements, the semiconductor switching elements of the analog switches having a substantially same driving capacity, such that the analog switches have their respective driving capacities that vary depending on the capacitances of the capacitors.

In the digital-to-analog conversion circuit, a larger number of semiconductor switching elements are used in an analog switch for a higher-order bit having a higher maximum connection capacitance, whereas a smaller number of semiconductor switching elements are used in an analog switch for a lower-order bit having a lower maximum connection capacitance. The driving capacities of the analog switches are thereby varied according to the capacitance of the capacitors. Accordingly, reduction of the occupation area of the digital-to-analog conversion circuit is achievable. Further because it is also possible to uniform the time periods required to charge the capacitors, it is possible to improve the digital-to-analog conversion accuracy. These effects are rendered more effectively in a digital-to-analog conversion circuit for a multi-bit digital signal in which the difference between the capacitance of a capacitor for a low-order bit and that of a capacitor for a high-order bit increases with the number of the bits.

In one embodiment, each semiconductor switching element comprises at least one of an N-channel transistor or a P-channel transistor, the transistors of the semiconductor switching elements having a substantially same gate width.

This arrangement enables the integration of the circuit. Therefore it is possible to reduce the circuit scale of the digital-to-analog conversion circuit. By setting the channel type of the transistor according to the relationship between the reference potential inputted from the outside and a gate voltage of the transistor constituting the analog switch, it is possible to avoid an insufficient charging owing to the influence of the threshold of the transistor. Further, because the gate widths of transistors constituting the analog switches are uniform, it is possible to make uniform the influence of a mask shift amount and an etching shift amount, caused by the manufacturing process, on the transistors. Consequently, variations in the characteristics among the transistors are suppressed. In addition, by making the gate widths of transistors constituting the analog switches uniform, it is possible to allow a mask shift amount and an etching shift amount caused by the manufacturing process to render a uniform influence on the transistors. Consequently, it is possible to prevent the transistors from being varied in the characteristics. In the case where polycrystalline silicon is used as an active layer of the transistor, its grain size will vary in the range from several micrometers to several hundreds of micrometers, depending on a forming method. In recent years, owing to the progress of crystallization technology, it has been possible to allow the grain sizes to be uniformly several tens of micrometers. In this case, by designing the gate width and length of the transistor to be less than the grain size, it is possible to remove the grain boundary, which is one of the main causes of variation in the characteristic of the crystalline silicon transistor, from the active layer (channel portion) of the transistor. Therefore further improvement of the digital-to-analog conversion accuracy is expected by making the gate width of the transistor of the analog switch less than the grain size of the polycrystalline silicon which is used as the active layer and by connecting a necessary number of transistors in parallel with one another such that the driving capacities of the analog switches increase in a sequential order.

Furthermore, the present invention provides a digital-to-analog conversion circuit of charge distribution type comprising:

a plurality of capacitors having respective capacitances that increase in a sequential order, one end of the capacitors being commonly connected electrically; and a plurality of analog switches each for electrically connecting a reference potential corresponding to a digital signal inputted from outside to the other end of the corresponding capacitor, the digital-to-analog conversion circuit outputting an analog signal corresponding to a potential at the commonly connected one end of the capacitors, wherein the plurality of analog switches have respective driving capacities that vary depending on the capacitances of the capacitors;

each of the analog switches whose respective driving capacities are not more than a predetermined value has a single semiconductor switching element, the semiconductor switching elements of the analog switches having respective driving capacities varied depending on the capacitances of the capacitors charged through the individual analog switches; and each of the analog switches whose respective driving capacities are more than the predetermined value has a plurality of parallel-connected semiconductor switching elements whose driving capacities are substantially same and not more than the predetermined value.

In this digital-to-analog conversion circuit with the above construction, a single semiconductor switching element having a higher driving capacity is used in an analog switch corresponding to a higher-order bit having a high maximum connection capacitance and a single semiconductor switching element having a lower driving capacity is used in an analog switch corresponding to a lower-order bit having a lower maximum connection capacitance as far as the driving capacity of the single switching element reaches the predetermined value. In this manner, the driving capacities of those analog switches are varied depending on the capacitances of the capacitors. On the other hand, when analog switches are required to have driving capacities over the predetermined value, a plurality of semiconductor switching elements having substantially identical driving capacities are used in parallel combination, instead of a single switching element. In this case, a larger number of semiconductor switching elements are used in an analog switch corresponding to a higher-order bit having a high maximum connection capacitance and a smaller number of semiconductor switching elements are used in an analog switch corresponding to a lower-order bit having a lower maximum connection capacitance. In this manner, the driving capacities of these analog switches are varied depending on the capacitances of the capacitors. Accordingly, reduction of the occupation area of the digital-to-analog conversion circuit is achievable. Further because it is possible to make time periods required to charge the capacitors to be uniform, improvement of the digital-to-analog conversion accuracy is also achievable. These effects are displayed more effectively in a digital-to-analog conversion circuit for a multi-bit digital signal in which there is a big difference between the capacitance of a capacitor for a low-order bit and that of a capacitor for a high-order bit.

In one embodiment, each semiconductor switching element comprises at least one of an N-channel transistor or a P-channel transistor, and a driving capacity of each transistor is set by a gate width thereof.

According to the digital-to-analog conversion circuit of the embodiment, by using the N-channel transistor and/or the P-channel transistor as the analog switch, integration can be accomplished. Therefore it is possible to reduce the circuitry scale of the digital-to-analog conversion circuit. Further by setting the channel type of the transistor according to the relationship between a reference potential inputted from the outside and a gate voltage of the transistor of the analog switch, it is possible to avoid an insufficient charging which occurs owing to the influence of the threshold of the transistor. If there is an upper limit in the gate widths of the transistors owing to a manufacturing process and if an analog switch is required to have a driving capacity that would be provided by a gate width beyond the upper limit or the above predetermined value of a single transistor, a plurality of parallel connected transistors having almost the same-width gate width equal to or less than the predetermined value are used. Thus it is possible to allow a mask shift amount and an etching shift amount caused by the manufacturing process to render a uniform influence on the transistors. Consequently, variations of the transistor characteristics are suppressed.

According to another aspect of the present invention, there is provided a image display apparatus comprising:

a plurality of pixels arrayed in a matrix form;

a plurality of data signal lines extending along columns of the pixels;

a plurality of scanning signal lines extending along rows of the pixels;

a data signal line driving circuit supplying analog image data corresponding to digital image data to the data signal lines; and a scanning signal line driving circuit supplying a scanning signal to the scanning signal lines, wherein the data signal line driving circuit comprises any one of the above-described digital-to-analog conversion circuits.

With the above arrangement, the optimum design of the digital-to-analog conversion circuit makes the data signal line driving circuit including the digital-to-analog conversion circuit compact and thereby reduces a display driving circuit area without reducing a display region. Thus the image display apparatus will have a reduced frame portion.

In one embodiment, the data signal line driving circuit, the scanning signal line driving circuit, and the pixels are formed on a single substrate.

In this case, it is possible not only to reduce the assembly cost but also to enhance reliability because connection portions between the pixels and the data signal line driving circuit and scanning signal line driving circuit are eliminated.

In one embodiment, active elements included in the data signal line driving circuit, the scanning signal line driving circuit, and the pixels are formed of polycrystalline silicone thin film transistors.

Forming the active elements, such as the semiconductor switching elements, of the polycrystalline silicone thin film transistors makes it possible to form the driving circuits and the pixels on the same substrate by the same manufacturing process. Thus it is possible to reduce the manufacturing costs.

In one embodiment, the substrate is a glass substrate and the polycrystalline silicone thin film transistors have been formed on the glass substrate in a manufacturing process using a temperature of 600° C. or lower.

Because the glass substrate having a low melting point, which is inexpensive, is used, the image display apparatus can be provided at a low cost.

BRIEF DESCRIPTION OF THE DRAWINGS

The present invention will become more fully understood from the detailed description given hereinbelow and the accompanying drawings which are given by way of illustration only, and thus are not limitative of the present invention, and therein.

DETAILED DESCRIPTION OF THE PREFERRED EMBODIMENTS (First Embodiment)

Figure 1:
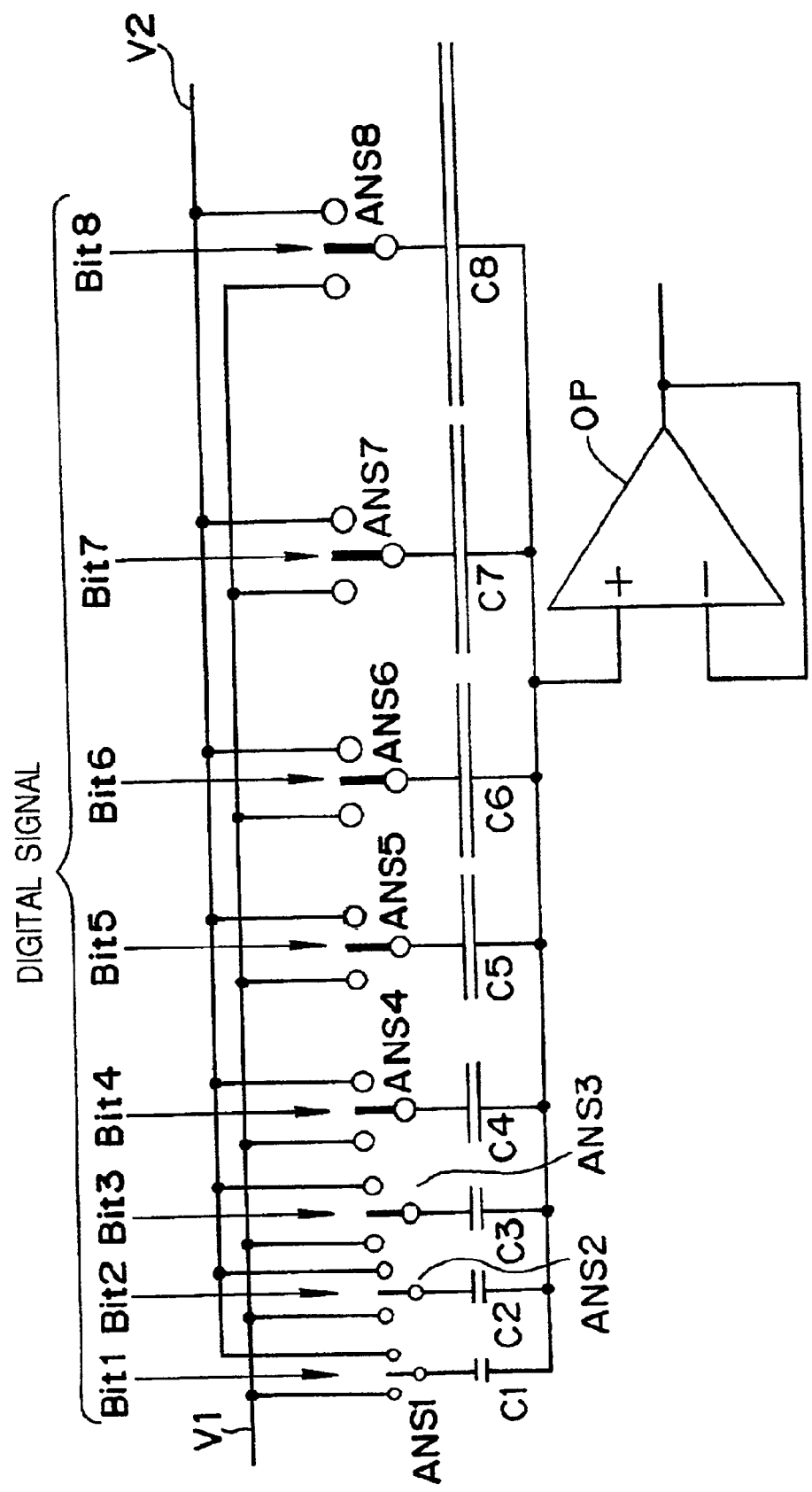
FIG. 1 shows the basic construction of a digital-to-analog conversion circuit according to a first embodiment of the present invention.

FIG. 1 shows the basic construction of a digital-to-analog conversion circuit of charge distribution type according to a first embodiment of the present invention. For the sake of simplicity, the digital-to-analog conversion circuit shown in FIG. 1 is designed to receive an 8-bit digital signal.

As shown in FIG. 1, the digital-to-analog conversion circuit includes electric charge distribution capacitors C1–C8, a plurality of analog switches ANS1–ANS8 connecting a reference potential V1 or reference potential V2 to one end of the capacitors C1–C8 respectively, and an operation amplifier OP having a non-inversion input terminal, an inversion input terminal and an output terminal. The commonly connected other end of each of the capacitors C1–C8 is connected to the non-inversion input terminal, and the output terminal is connected to the inversion input terminal. As digital image data, bits Bit1–Bit8 of a digital signal are inputted to control input terminals (not shown) of the analog switches ANS1–ANS8 respectively. The operational amplifier OP is provided as necessary.

Depending on the bits Bit1–Bit8 of the digital signal, the analog switches ANS1–ANS8 connect one end of each of the capacitors C1–C8 to the reference potential V1 or to the reference potential V2. That is, in the case where the bit of the inputted digital signal is "1", the one end of the corresponding capacitor C1–C8 is connected to the reference potential V1, whereas in the case where the bit thereof is "0", the one end of the corresponding capacitor C1–C8 is connected to the reference potential V2.

The capacitances of the capacitors C1–C8 are changed sequentially, namely, increase at the rate of $2^0:2^1:2^2:2^3:2^4:2^5:2^6:2^7$ in the order of bit position from the least significant bit Bit1 to the most significant bit Bit 8. Thus supposing that the capacitance of the capacitor C1 is CA, the capacitances of the capacitors C2–C8 are 2CA, 4CA, 8CA, 16CA, 32CA, 64CA, and 128CA respectively.

In the digital-to-analog conversion circuit having the above construction, the analog switch corresponding to the bit at a high-level of the digital signal connects the one end of the capacitor to the reference potential V1, whereas the analog switch corresponding to the bit at a low-level of the digital signal connects the one end of the capacitor to the reference potential V2. Consequently, a charge distribution occurs between capacitors whose one end is connected to the reference potential V1 and the other capacitors whose one end is connected to the reference potential V2, and a potential corresponding to the inputted digital signal is generated at the commonly connected other end of the capacitors C1–C8. Based on the potential, a data signal is outputted from the output terminal of the operational amplifier OP.

The driving capacity of each of the analog switches ANS1–ANS8 is indicated by the thickness of a line of a switching portion thereof (namely, a thicker line has a higher driving capacity than a thinner line). More specifically, the analog switch ANSI for the least significant bit (Bit1) has the smallest driving capacity. The driving capacity of the analog switches ANS2, ANS3, ANS4, ANS5, ANS6, and ANS7 increases in the order of ANS2, ANS3, ANS4, ANS5, ANS6, and ANS7. Then, the analog switch ANS8 for the most significant bit (Bit8) has the largest driving capacity. That is, considering that connection capacitances as viewed from each of the analog switches ANSW1–ANSW8 are different from one another, the driving capacities of the analog switches ANS1–ANS8 are varied accordingly so as to increase in a sequential order. By thus doing, it is possible to equalize time periods required to charge the capacitors C1–C8 through the analog switches ANS1–ANS8 and reduce the area occupied by the analog switches ANS1–ANS8 in the digital-to-analog conversion circuit. Hence an optimum design of the digital-to-analog conversion circuit can be accomplished.

Table 1 shows maximum connection capacitances of the charge distribution capacitors C1–C8 with respect to each analog switch ANS1–ANS8, and the input digital signal corresponding to each of the maximum connection capacitances.

TABLE 1

| Analog switch | Digital Signal | | | | | | | | Maximum connection capacitance |
|---|---|---|---|---|---|---|---|---|---|
| | LSB Bit1 | Bi2 | Bit3 | Bit4 | Bit5 | Bit6 | Bit7 | MSB Bit8 | |
| ANS1 | 1 | 0 | 0 | 0 | 0 | 0 | 0 | 0 | (254/255)CA |
| ANS2 | 0 | 1 | 0 | 0 | 0 | 0 | 0 | 0 | (506/255)CA |
| ANS3 | 0 | 0 | 1 | 0 | 0 | 0 | 0 | 0 | (1004/255)CA |
| ANS4 | 0 | 0 | 0 | 1 | 0 | 0 | 0 | 0 | (1976/255)CA |
| ANS5 | 0 | 0 | 0 | 0 | 1 | 0 | 0 | 0 | (3824/255)CA |
| ANS6 | 0 | 0 | 0 | 0 | 0 | 1 | 0 | 0 | (7136/255)CA |
| ANS7 | 0 | 0 | 0 | 0 | 0 | 0 | 1 | 0 | (12224/255)CA |
| ANS8 | 0 | 0 | 0 | 0 | 0 | 0 | 0 | 1 | (16256/255)CA |

As indicated in table 1, the maximum connection capacitance corresponding to the analog switch ANS1 assigned to the least significant bit (Bit1) is (254/255)CA, whereas the maximum connection capacitance corresponding to the analog switch ANS8 assigned to the most significant bit (Bit8) is (16256/255)CA which is 64 times as large as (254/255)CA. The difference in charge time periods between connections of different capacitances is reduced by changing the driving capacities of the analog switches ANS1–ANS8 such that the driving capacity sequentially increases from the analog switch ANS1 to the analog switch ANS8. Further in the case where the driving capacity of each of the analog switches ANS1–ANS8 is determined according to geometric sizes thereof, it is possible to reduce the areas of the capacitors C1–C8 in the digital-to-analog conversion circuit by designing the analog switches ANS1–ANS7 having lower required driving capacities in a size one-several tenth to half the size of the analog switch ANS8 having the highest required driving capacity.

(Second Embodiment)

Figure 2:
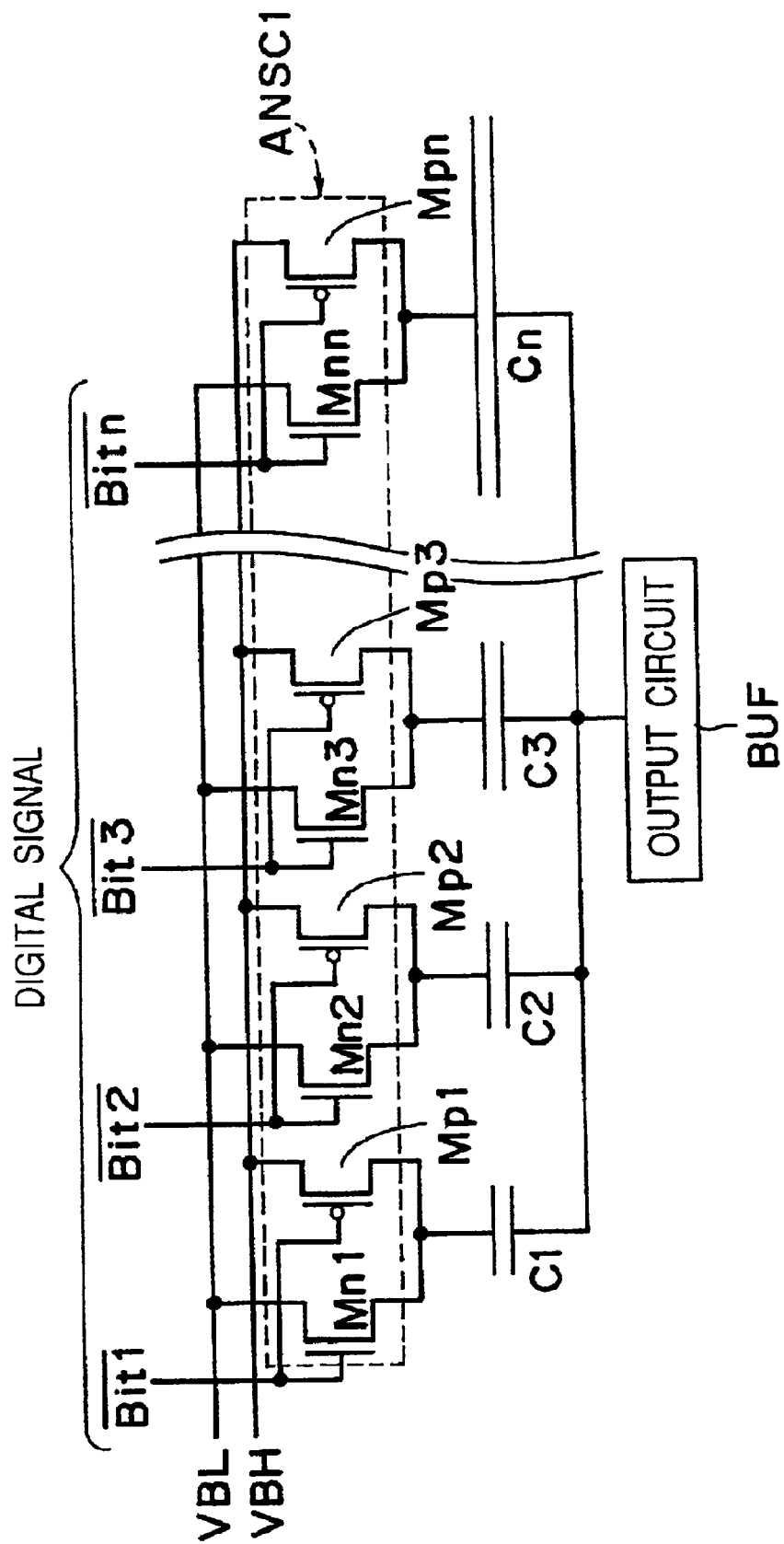
FIG. 2 shows the construction of a digital-to-analog conversion circuit according to a second embodiment of the present invention.

FIG. 2 schematically shows the construction of a digital-to-analog conversion circuit of charge distribution type according to a second embodiment of the present invention. In this embodiment, transistors are used as analog switches.

As shown in FIG. 2, the digital-to-analog conversion circuit includes electric charge distribution capacitors C1–Cn, an analog switch circuit ANSC1 connecting a reference potential VBL or a reference potential VBH to one end of each of the capacitors C1–Cn, and an output circuit BUF amplifying a potential at the commonly connected other end of the capacitors C1–Cn to output the amplified potential.

The analog switch circuit ANSC1 includes N-channel transistors Mn1–Mnn connecting/disconnecting the one end of each of the electric charge distribution capacitors C1–Cn to/from the reference potential VBL, and P-channel transistors Mp1–Mpn connecting/disconnecting the one end of each of the electric charge distribution capacitors C1–Cn to/from the reference potential VBH. Inverted digital signals /Bit1–/Bitn are supplied to the gates of the N-channel transistors Mn1–Mnn and the P-channel transistors Mp1–Mpn respectively.

The capacitances of the capacitors C1–Cn are varied to increase at the ratio of $2^0:2^1:2^2:2^3:2^4:2^5:2^6:2^7$ ... in this order from the least significant bit Bit1 of the digital signal to its most significant bit Bitn. Thus supposing that the capacitance of the capacitor C1 is CA, the capacitances of the capacitors C2–Cn are 2CA, 4CA, 8CA, 16CA, 32CA, 64CA, 128CA, ... respectively.

The driving capacities of the N-channel transistors Mn1–Mnn and of the P-channel transistors Mp1–Mpn are also varied according to the capacitances of the associated capacitors C1–Cn respectively so as to be increased in the order from Mn1 to Mnn and from Mp1 to Mpn.

In the digital-to-analog conversion circuit, supposing that the two reference potentials are VBH and VBL (VBH>VBL), the high level of the digital signal is VGH, the low level thereof is VGL, the threshold of the N-channel transistor is Vthn, and that the threshold of the P-channel transistor is Vthp, the following conditions are established:

$VGL-Vthn \ll VBL$ $VBL+Vthn \ll VGH$ $VGL \ll VBH+Vthp$ $VBH \ll VGH-Vthp$

In the digital-to-analog conversion circuit, at a portion which corresponds to a low-level bit of an input digital signal (namely a portion where a high-level is applied to the gates of the transistors), the reference potential VBL is supplied to the charge distribution capacitor, with the N-channel transistor turned on and the P-channel transistor turned off. At a portion which corresponds to a high-level bit of an input digital signal (namely a portion where a low-level is applied to the gates of the transistors), the reference potential VBH is supplied to the charge distribution capacitor, with the N-channel transistor turned off and the P-channel transistor turned on. As a result, there occurs a charge distribution between capacitors whose one end is connected to the reference potential VBH and the other capacitors whose one end is connected to the reference potential VBL. Thus a potential corresponding to the input digital signal is generated at the commonly connected other end of the capacitors C1–Cn. Based on that potential, a data signal is outputted from the output circuit BUF.

In the digital-to-analog conversion circuit of the second embodiment, because the single phase digital signals (all inverted phase) are inputted, wiring can be easily done on a layout. Thus reduction of the circuit scale can be expected.

In the digital-to-analog conversion circuit, parameters such as the gate length L of the transistor, the gate width W, and the mobility $\mu$ determine the driving capacity of the transistor of the analog switch. The gate length L of the transistor and the mobility $\mu$ are uniquely determined according to specifications and manufacturing process conditions. Accordingly, a required driving capacity of the transistor is secured by changing the gate width W.

(Third Embodiment)

Figure 3:
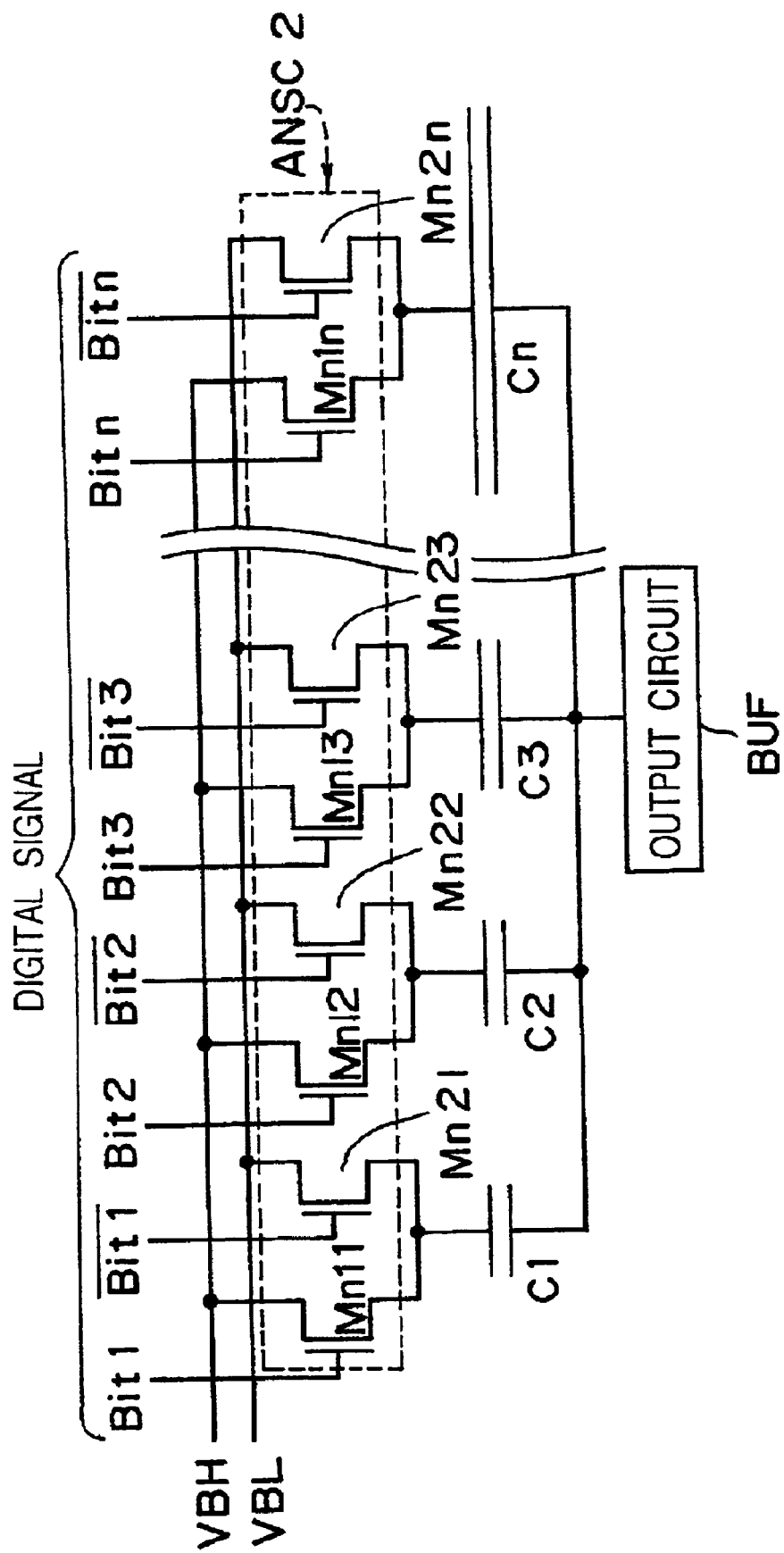
FIG. 3 shows the construction of a digital-to-analog conversion circuit according to a third embodiment of the present invention.

FIG. 3 schematically shows the construction of a digital-to-analog conversion circuit of charge distribution type according to a third embodiment of the present invention.

As shown in FIG. 3, the digital-to-analog conversion circuit includes electric charge distribution capacitors C1–Cn, an analog switch circuit ANSC2 connecting a reference potential VBL or a reference potential VBH to one end of each of the capacitors C1–Cn, and an output circuit BUF outputting a data signal by amplifying a potential at the commonly connected other end of the capacitors C1–Cn.

The analog switch circuit ANSC2 includes N-channel transistors Mn11–Mn1n connecting/disconnecting the one end of the electric charge distribution capacitors C1–Cn to/from the reference potential VBH, and N-channel transistors Mn21–Mn2n connecting/disconnecting the one end of the electric charge distribution capacitors C1–Cn to/from the reference potential VBL. Digital signals Bit1–Bitn of one phase are supplied to the gates of the N-channel transistors Mn11–Mn1n respectively, whereas digital signals /Bit1–/Bitn of opposite phase are supplied to the gates of the N-channel transistors Mn21–Mn2n respectively.

The capacitances of the capacitors C1–Cn are varied to increase at the ratio of $2^0:2^1:2^2:2^3:2^4:2^5:2^6:2^7$ ... from the least significant Bit1 of the digital signal to its most significant bit Bitn. Thus supposing that the capacitance of the capacitor C1 is CA, the capacitances of the capacitors C2–Cn are 2CA, 4CA, 8CA, 16CA, 32CA, 64CA, 128CA, ... respectively.

Also, the driving capacities of the N-channel transistors Mn11–Mn1n and the N-channel transistors Mn21–Mn2n are also changed according to the capacitances of the associated capacitors C1–Cn respectively so as to be sequentially increased in that order.

Supposing that the high level of the digital signal is VGH, the low level thereof is VGL, and that the threshold of the N-channel transistor is Vthn, the following conditions are established:

$$VGL - Vthn \ll VBL$$

$$VBL + Vthn \ll VGH$$

In the digital-to-analog conversion circuit, of the N-channel transistors Mn11–Mn1n, transistors corresponding to the high-level bits of the digital signal are turned on, and of the N-channel transistors Mn21–Mn2n, transistors corresponding to the high-level bits of the digital signal are turned off, so that the reference voltage VBH is supplied to the charge distribution capacitors connected to the on-state ones of the N-channel transistors Mn11–Mn1n. On the other hand, of the N-channel transistors Mn11–Mn1n, transistors corresponding to the low-level bits of the digital signal are turned off, and of the N-channel transistors Mn21–Mn2n, transistors corresponding to the low-level bits of the digital signal are turned on, whereby the reference voltage VBL is supplied to the charge distribution capacitors connected to the on-state ones of the N-channel transistors Mn21–Mn2n. As a result, there occurs a charge distribution between the capacitors whose one end is connected to the reference potential VBH and the capacitors whose one end is connected to the reference potential VBL. Thus a potential corresponding to the inputted digital signal is generated at the commonly connected other end of the capacitors C1–Cn. Based on the potential, a data signal is outputted from the output circuit BUF.

In the digital-to-analog conversion circuit of the third embodiment, because the analog switch circuit ANSC2 can be constructed of transistors of single channel (namely, of the same conductive type), the drain regions can be shared on the circuit layout. Thus it is possible to obtain an advantage that the transistors have the uniform characteristic and thus expect improvement of accuracy in the digital-to-analog conversion. Further it is possible to allow the occupation area of the analog switch circuit ANSC2 in the digital-to-analog conversion circuit to be smaller than that of the analog switch circuit constructed of the N-channel transistors and the P-channel transistors.

In the digital-to-analog conversion circuit of the third embodiment, specified driving capacities of the analog switches can be secured by changing the gate widths W of the N-channel transistors Mn11–Mn1n and the N-channel transistors Mn21–Mn2n, similarly to the second embodiment.

(Fourth Embodiment)

Figure 4:
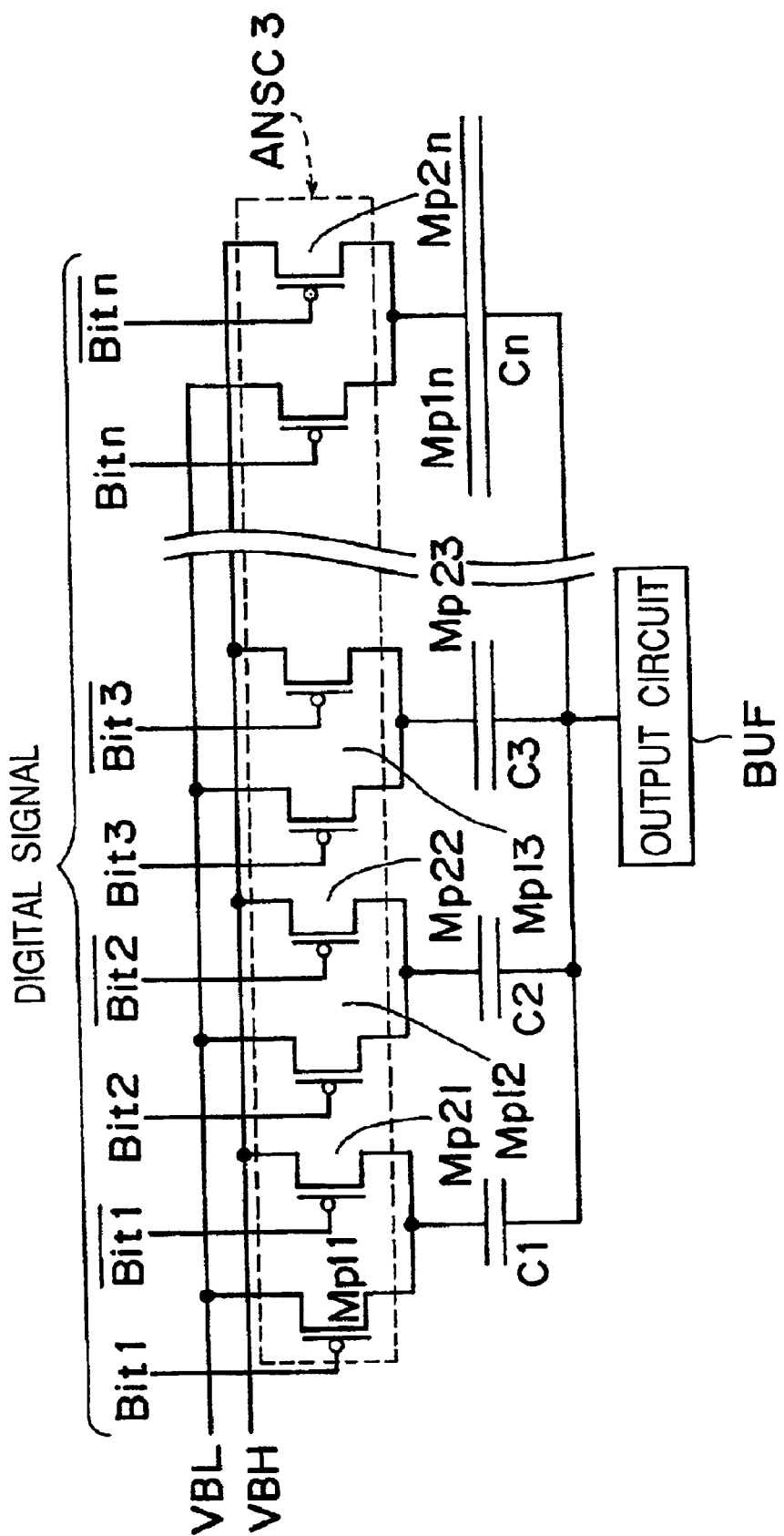
FIG. 4 shows the construction of a digital-to-analog conversion circuit according to a fourth embodiment of the present invention.

FIG. 4 schematically shows the construction of a digital-to-analog conversion circuit of charge distribution type according to a fourth embodiment of the present invention.

As shown in FIG. 4, the digital-to-analog conversion circuit includes electric charge distribution capacitors C1–Cn, an analog switch circuit ANSC3 connecting a reference potential VBL or a reference potential VBH to one end of each of the capacitors C1–Cn, and an output circuit BUF outputting a data signal by amplifying a potential at the commonly connected other end of the capacitors C1–Cn.

The analog switch circuit ANSC3 includes P-channel transistors Mp11–Mp1n connecting/disconnecting the one end of each of the electric charge distribution capacitors C1–Cn to/from the reference potential VBH, and P-channel transistors Mp21–Mp2n connecting/disconnecting the one end of each of the electric charge distribution capacitors C1–Cn to/from the reference potential VBL. Digital signals Bit1–Bitn of a phase are supplied to the gates of the P-channel transistors Mp11–Mp1n respectively, whereas digital signals /Bit1–/Bitn of opposite phase are supplied to the gates of the P-channel transistors Mp21–Mp2n respectively.

The capacitances of the capacitors C1–Cn are changed to increase at the ratio of $2^0:2^1:2^2:2^3:2^4:2^5:2^6:2^7$ ... in the order of bit position in the digital signal from the least significant bit Bit1 to its most significant bit Bitn. Thus supposing that the capacitance of the capacitor C1 is CA, the capacitances of the capacitors C2–Cn are 2CA, 4CA, 8CA, 16CA, 32CA, 64CA, 128CA, ... respectively.

The driving capacities of the P-channel transistors Mp11–Mp1n and the P-channel transistors Mp21–Mp2n are also varied according to the capacitances of the associated capacitors C1–Cn so as to be increased sequentially in that order.

Supposing that the high level of the digital signal is VGH, the low level thereof is VGL, and that the thresholds of the P-channel transistors are uniformly Vthp, the following conditions are established:

$$VGL \ll VBL + Vthp$$

$$VBH \ll VGH - Vthp$$

In the digital-to-analog conversion circuit, of the P-channel transistors Mp11–Mp1n, transistors corresponding to the high-level bits of the digital signal are turned off, and of the P-channel transistors Mp21–Mp2n, transistors corresponding to the high-level bits of the digital signal are turned on, so that the reference voltage VBH is supplied to the charge distribution capacitors connected to the on-state ones of the P-channel transistors Mp21–Mp2n. On the other hand, of the P-channel transistors Mp11–Mp1n, transistors corresponding to the low-level bits of the digital signal are turned on, and of the P-channel transistors Mp21–Mp2n, transistors corresponding to the low-level bits of the digital signal are turned on, whereby the reference voltage VBL is supplied to the charge distribution capacitors connected to the on-state ones of the P-channel transistors Mp11–Mp1n. As a result, there occurs a charge distribution between the capacitors whose one end is connected to the reference potential VBH and the capacitors whose one end is connected to the reference potential VBL. Thus a potential corresponding to the inputted digital signal is generated at the commonly connected other end of the capacitors C1–Cn. Based on the potential, a data signal is outputted from the output circuit BUF.

In the digital-to-analog conversion circuit of the fourth embodiment, because the analog switch circuit ANSC2 can be constructed of transistors of single channel (namely, of the same conductive type), the drain regions can be shared on the circuit layout. Thus it is possible to obtain an advantage that the transistors have the uniform characteristic and thus expect improvement of accuracy in the digital-to-analog conversion. Further it is possible to allow the occupation area of the analog switch circuit ANSC2 in the digital-to-analog conversion circuit to be smaller than that of the analog switch circuit constructed of the N-channel transistors and the P-channel transistors.

Also, in the digital-to-analog conversion circuit of the fourth embodiment, specified driving capacities of the analog switches can be secured by changing the gate widths W of the P-channel transistors Mp11–Mp1n and the P-channel transistors Mp21–Mp2n, similarly to the second embodiment.

(Fifth Embodiment)

Figure 5:
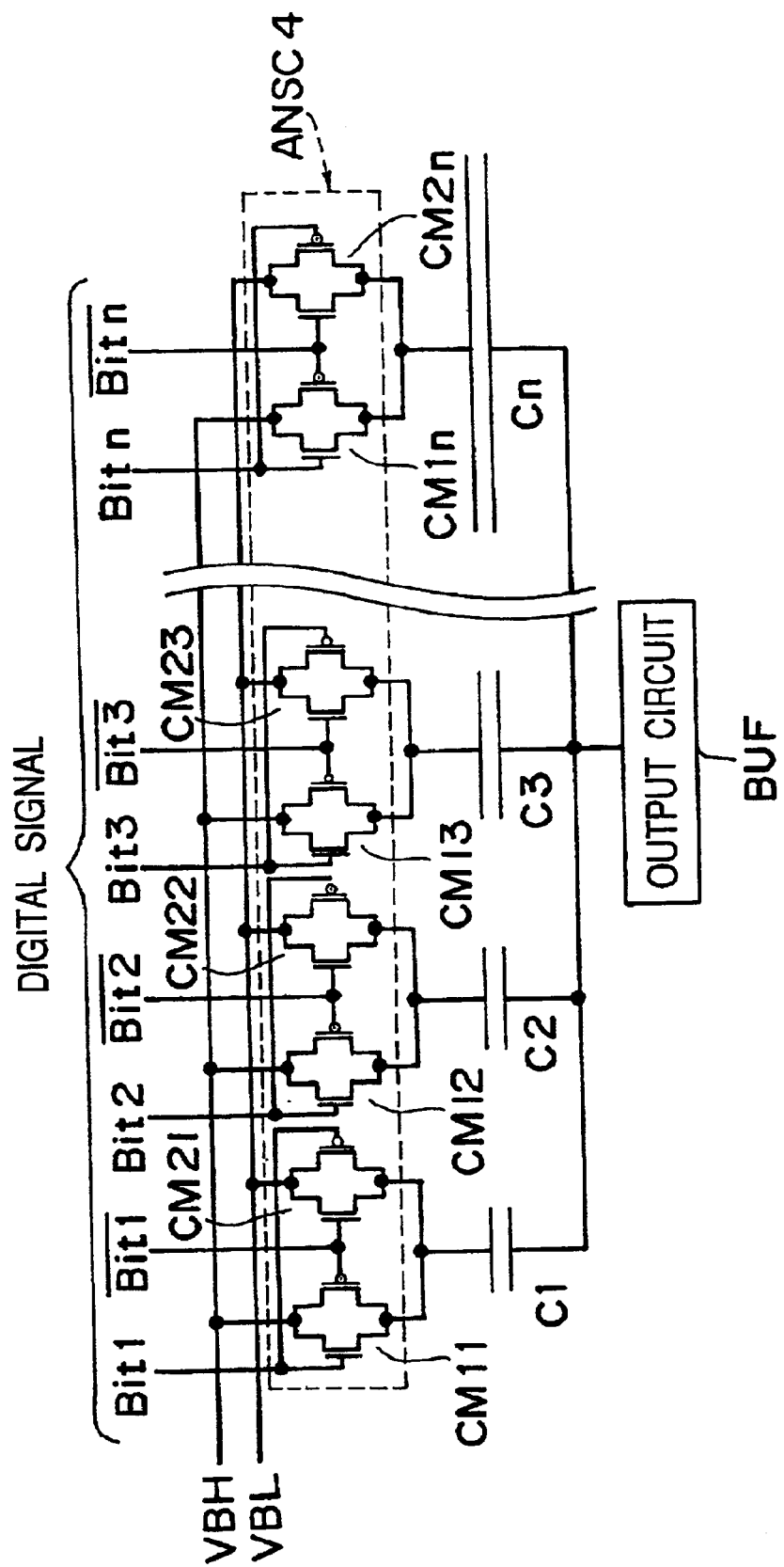
FIG. 5 shows the construction of a digital-to-analog conversion circuit according to a fifth embodiment of the present invention.

FIG. 5 schematically shows the basic construction of a digital-to-analog conversion circuit of charge distribution type according to a fifth embodiment of the present invention. The digital-to-analog conversion circuit uses a CMOS analog switch including N-channel transistors and P-channel transistors.

As shown in FIG. 5, the digital-to-analog conversion circuit includes electric charge distribution capacitors C1–Cn, an analog switch circuit ANSC4 connecting a reference potential VBL or a reference potential VBH to one end of each of the capacitors C1–Cn, and an output circuit BUF outputting a data signal by amplifying a potential at the commonly connected other end of the capacitors C1–Cn.

The analog switch circuit ANSC4 includes CMOS analog switches CM11–CM1n, each consisting of an N-channel transistor and a P-channel transistor connected in parallel to each other, which connect/disconnect the one end of each of the electric charge distribution capacitors C1–Cn to/from the reference potential VBH. The analog switch circuit ANSC4 also includes CMOS analog switches CM21–CM2n, each consisting of an N-channel transistor and a P-channel transistor connected in parallel to each other, which connect/disconnect the one end of each of the electric charge distribution capacitors C1–Cn to the reference potential VBL.

Digital signals Bit1–Bitn are supplied to the gates of the N-channel transistors of the CMOS analog switches CM11–CM1n respectively and the gates of the P-channel transistors of the CMOS analog switches CM21–CM2n respectively. On the other hand, digital signals of opposite phase /Bit1–/Bitn are supplied to the gates of the P-channel transistors of the CMOS analog switches CM11–CM1n respectively and the gates of the N-channel transistors of the CMOS analog switches CM21–CM2n respectively.

The capacitances of the capacitors C1–Cn are varied to increase at the ratio of $2^0:2^1:2^2:2^3:2^4:2^5:2^6:2^7$ ... in the order of bit position in the digital signal from the least significant bit Bit1 to its most significant bit Bitn. Thus supposing that the capacitance of the capacitor C1 is CA, the capacitances of the capacitors C2–Cn are 2CA, 4CA, 8CA, 16CA, 32CA, 64CA, 128CA, ... respectively.

The driving capacities of the P-channel transistors and the P-channel transistors in the CMOS analog switches CM11–CM1n and CM21–CM2n are also changed according to the capacitances of the associated capacitors C1–Cn so as to be increased sequentially.

In the digital-to-analog conversion circuit, with N-channel transistors and P-channel transistors, of the CMOS analog switches CM11–CM1n, corresponding to the high-level bits of the digital signal turned on, and with N-channel transistors and P-channel transistors, of the CMOS analog switches CM21–CM2n, corresponding to the high-level bits of the digital signal turned off, the reference voltage VBH is supplied to the charge distribution capacitors connected to the on-state CMOS analog switches. On the other hand, with N-channel transistors and P-channel transistors, of the CMOS analog switches CM11–CM1n, corresponding to the low-level bits of the digital signal turned off, and with N-channel transistors and P-channel transistors, of the CMOS analog switches CM21–CM2n, corresponding to the low-level bits of the digital signal turned on, the reference voltage VBL is supplied to the charge distribution capacitors connected to the on-state CMOS analog switches. As a result, there occurs a charge distribution between the capacitors whose one end is connected to the reference potential VBH and the other capacitors whose one end is connected to the reference potential VBL. Thus a potential corresponding to the inputted digital signal is generated at the commonly connected other end of the capacitors. Based on the potential, a data signal is outputted from the output circuit BUF.

Supposing that the high level of the digital signal is VGH, the low level thereof is VGL, the threshold of the N-channel transistor is Vthn, and that the threshold of the P-channel transistor is Vthp, the digital-to-analog conversion circuit of the fifth embodiment is practicable if the following conditions are met:

$$VGL << VBL+Vthn$$

$$VBH+Vthp << VGH$$

The digital-to-analog conversion circuit of the fifth embodiment is adaptable to the reference voltages VBH and VBL than the digital-to-analog conversion circuit of any of the second embodiment through the fourth embodiment. Therefore, the reference voltages VBH and VBL can be variable, which allows modulation of an output voltage in the digital-to-analog conversion process. For example, the digital-to-analog conversion circuit can be utilized for γ compensation of an image display apparatus in which the digital-to-analog conversion circuit is used in a data signal line driving circuit.

In the digital-to-analog conversion circuit of the fifth embodiment, a required driving capacity can be secured by changing the gate widths W of the N-channel transistors and the P-channel transistors of the CMOS analog switches CM11–CM1n and CM21–CM2n, similarly to the second embodiment.

(Sixth Embodiment)

Figure 6:
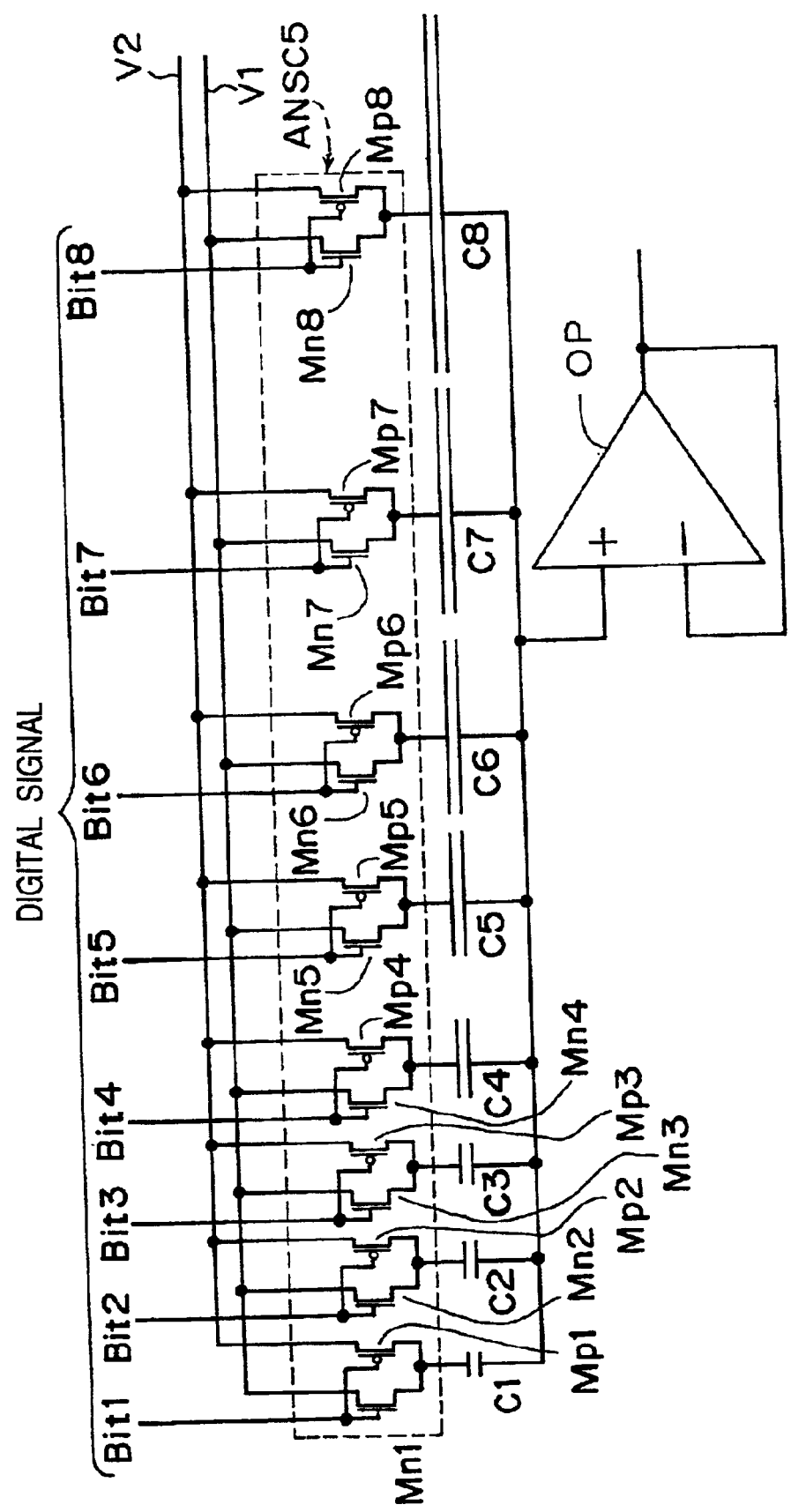
FIG. 6 shows the construction of a digital-to-analog conversion circuit according to a sixth embodiment of the present invention.

FIG. 6 schematically shows the basic construction of a digital-to-analog conversion circuit of charge distribution type according to a sixth embodiment of the present invention.

As shown in FIG. 6, the digital-to-analog conversion circuit includes electric charge distribution capacitors C1–C8, an analog switch circuit ANSC5 connecting a reference potential V1 or a reference potential V2 to one end of each of the capacitors C1–C8, and an output circuit BUF outputting a data signal by amplifying a potential at the commonly connected other end of the capacitors C1–C8.

The analog switch circuit ANSC5 includes N-channel transistors Mn1–Mn8 connecting/disconnecting the one end of each of the electric charge distribution capacitors C1–C8 to/from the reference potential V1. The analog switch circuit ANSC5 also includes P-channel transistors Mp1–Mp8 connecting/disconnecting the one end of each of the electric charge distribution capacitors C1–C8 to/from the reference potential V2. Digital signals Bit1–Bitn, not inverted, are supplied to the gates of the N-channel transistors Mn1–Mn8 respectively and the P-channel transistors Mp1–Mp8 respectively. The gate width W of each transistor is as follows:

| | |
|---|---|
| Mn1, Mp1: | 6 $\mu$m |
| Mn2, Mp2: | 12 $\mu$m |
| Mn3, Mp3: | 24 $\mu$m |
| Mn4, Mp4: | 47 $\mu$m |
| Mn5, Mp5: | 90 $\mu$m |
| Mn6, Mp6: | 169 $\mu$m |
| Mn7, Mp7: | 289 $\mu$m |
| Mn8, Mp8: | 384 $\mu$m |

In the digital-to-analog conversion circuit, as the ratio of the driving capacities of the analog switches, the maximum connection capacitance ratio for each analog switch shown in table 1 is used.

The capacitances of the capacitors C1–C8 are changed to increase at the ratio of $2^0:2^1:2^2:2^3:2^4:2^5:2^6:2^7$ in the order of bit position in the digital signal from the least significant bit Bit1 to the most significant bit Bit8. Thus supposing that the capacitance of the capacitor C1 is CA, the capacitances of the other capacitors C2–C8 are 2CA, 4CA, 8CA, 16CA, 32CA, 64CA, and 128CA, respectively.

Figure 7:
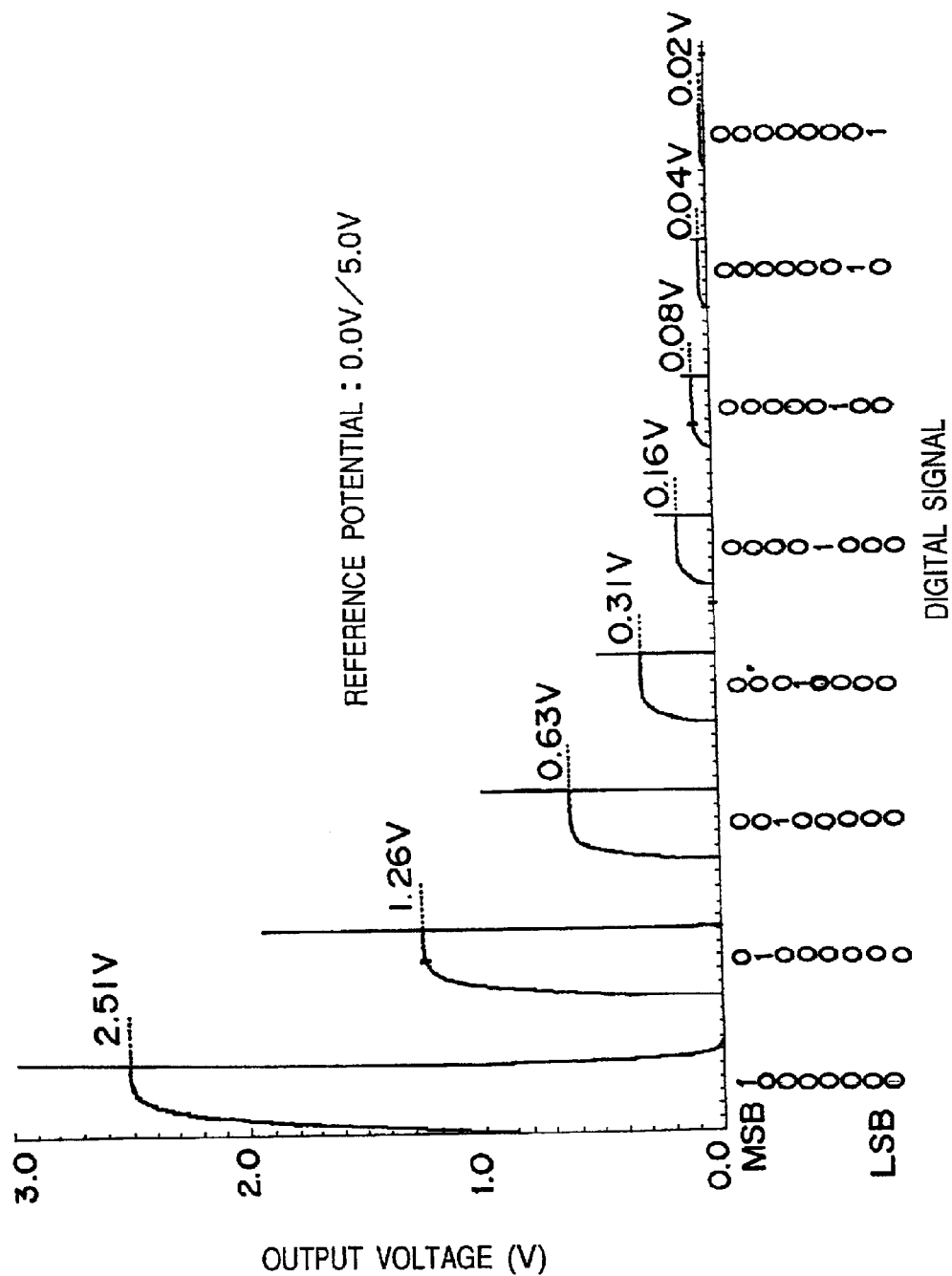
FIG. 7 shows the result of an operational simulation of the digital-to-analog conversion circuit.
Figure 18:
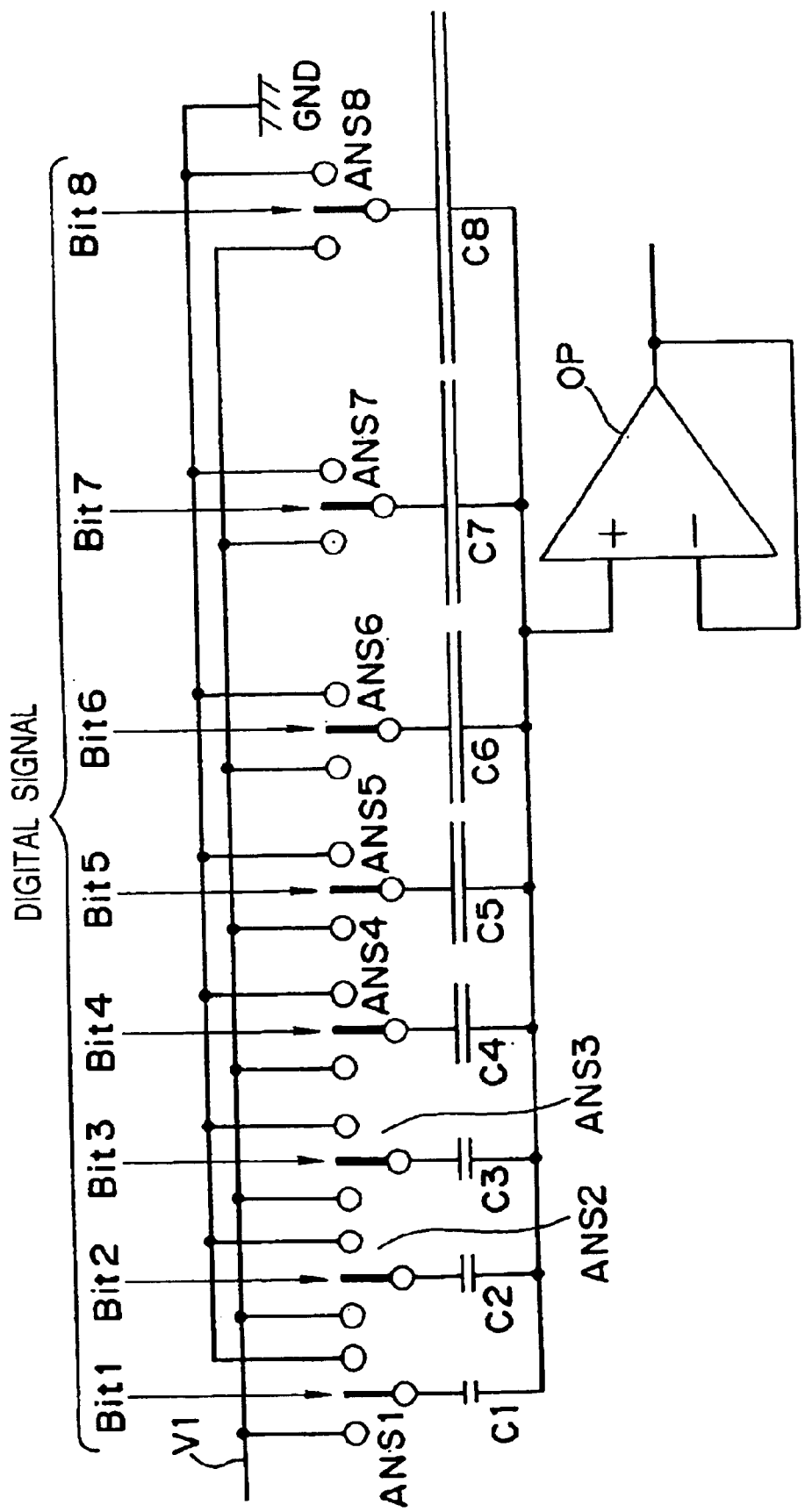
FIG. 18 shows the construction of a conventional digital-to-analog conversion circuit.

FIG. 7 shows simulation results regarding output voltages for various input digital signals under the condition that that the reference potentials are 0.0 V and 5.0 V, the high-level voltage of the digital signals is 15 V, the low-level voltage of the digital signals is 10 V, and that the basic capacitance is 1 pF. For the comparison purposes, FIG. 19 shows the result of a simulation conducted in the same condition as the above-described condition on the conventional digital-to-analog conversion circuit shown in FIG. 18 where all of the analog switches have an identical driving capacity which is set based on the driving capacity required of the analog switch for the most significant bit.

Figure 19:
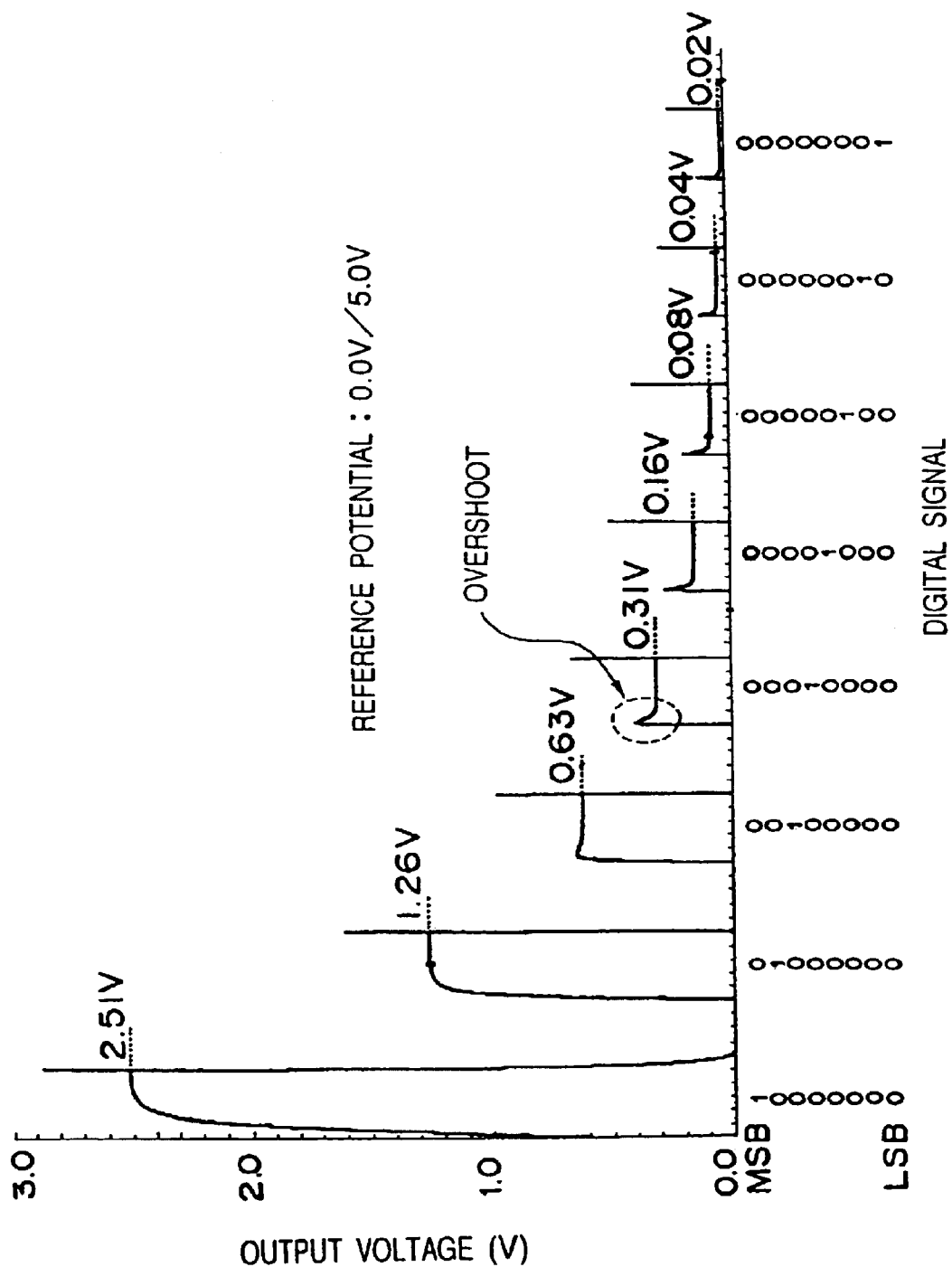
FIG. 19 shows the result of an operational simulation of the digital-to-analog conversion circuit.
Figure 20:
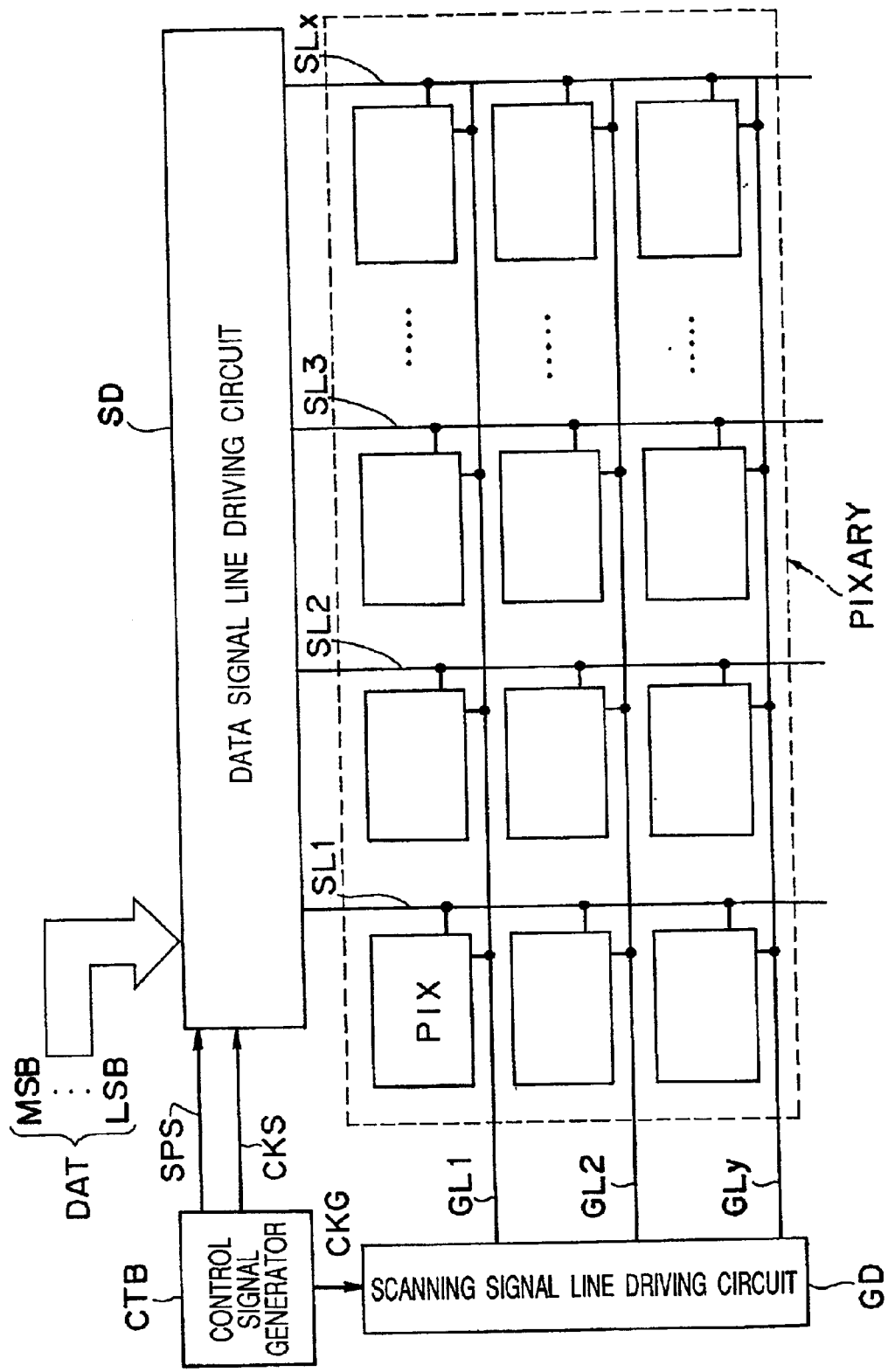
FIG. 20 is a block diagram showing the construction of a conventional image display apparatus of active matrix type.
Figure 21:
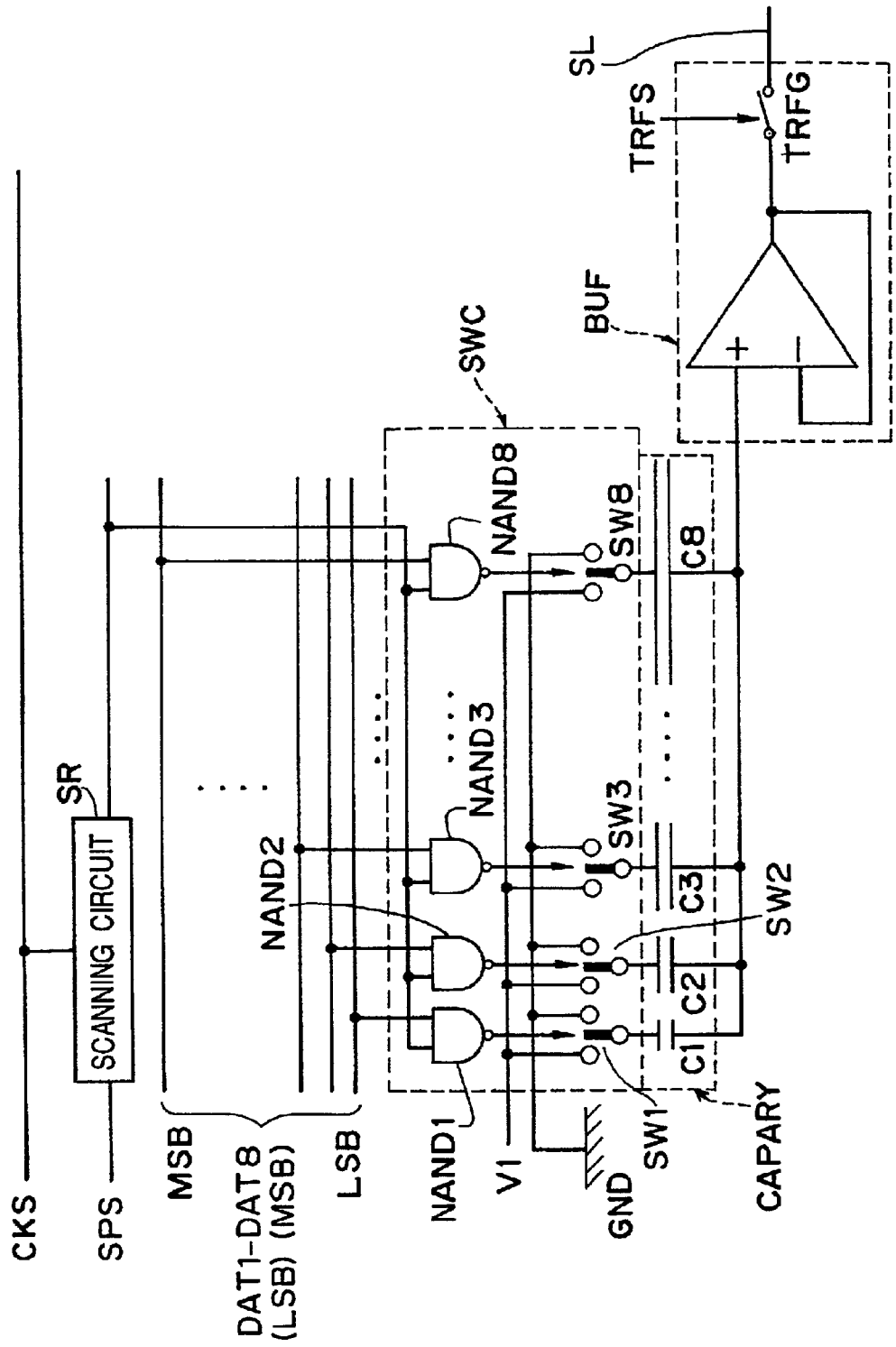
FIG. 21 shows the construction of a basic block in a conventional data signal line driving circuit.

Comparison between the result shown in FIG. 7 and that shown in FIG. 19 indicates that varying the driving capacities of the analog switches to increase them in a sequential order prevents occurrence of the phenomenon called "overshoot" that the output voltage rises over a desired voltage in an initial charge distribution stage when the charge distribution capacitors are charged, so that the flow direction of a charging current becomes constant for all the charge distribution capacitors.

In the digital-to-analog conversion circuit, the driving capacities of these analog switches are varied at a ratio equal to the ratio of the maximum connection capacitances of the analog switches. At this time, by taking account of ON-resistances of the transistors, it is assured that the flow directions of capacitor charging currents for the capacitors C1–C8 are made constant and hence the charging time periods for the capacitors C1–C8 are uniform. Further, influences of voltages caused by gate-drain capacitances of the transistors of the analog switches corresponding to each capacitor C1–C8 can be made equalized on each capacitance value. This is shown by the peak output voltages at a time of charging the charge distribution capacitors C1–C8.

Figure 8:
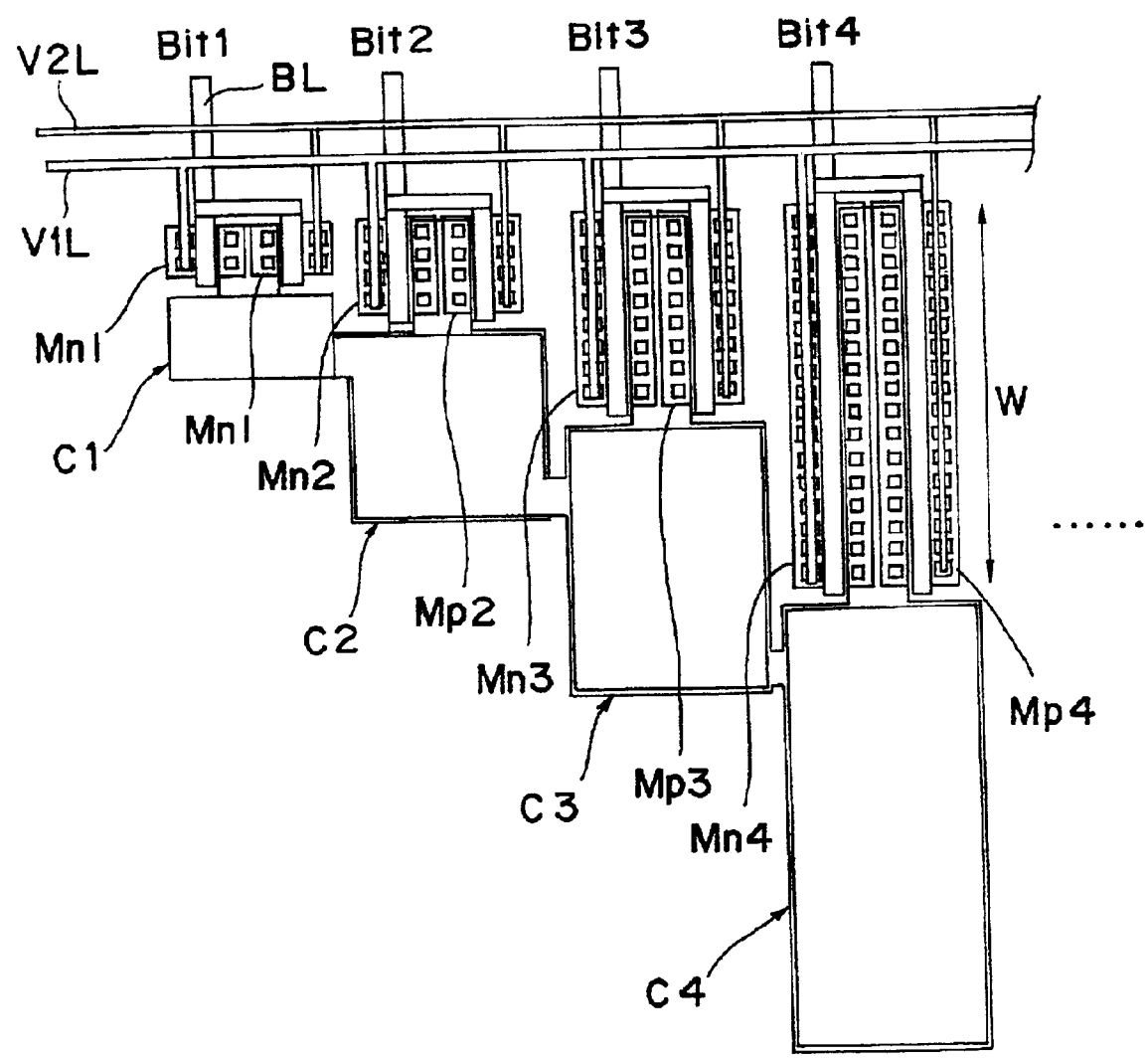
FIG. 8 shows an actual layout of lower four bits in the digital-to-analog conversion circuit.

FIG. 8 shows the layout of the lower four bits (Bit1–Bit4) in the digital-to-analog conversion circuit of the sixth embodiment. Referring to FIG. 8, reference symbol V1L denotes a wire for the reference voltage V1, reference symbol V2L denotes a wire for the reference voltage V2, and reference symbol BL denotes a wire for the digital signal. In the layout, the charge distribution capacitors C1–C4 are each constructed of a dielectric and two different kinds of metal layers sandwiching the dielectric therebetween. The capacitances of each of the capacitors C1–C4 are adjusted by the areas thereof. The area ratio among the charge distribution capacitors C1, C2, C3, C4, . . . is set to 1:2:4:8 . . . to obtain a capacitance ratio same as the area ratio. In the transistors Mn1, Mp1 . . . ; Mn4, Mp4 . . . constituting the analog switches connected to the capacitors C1, C2, C3, C4, . . . respectively, the gate widths of those transistors, which determine their own driving capacities, are varied so as to increase sequentially according to the maximum connection capacitances of the individual analog switches. Thus the layout area can be reduced.

(Seventh Embodiment)

Figure 9:
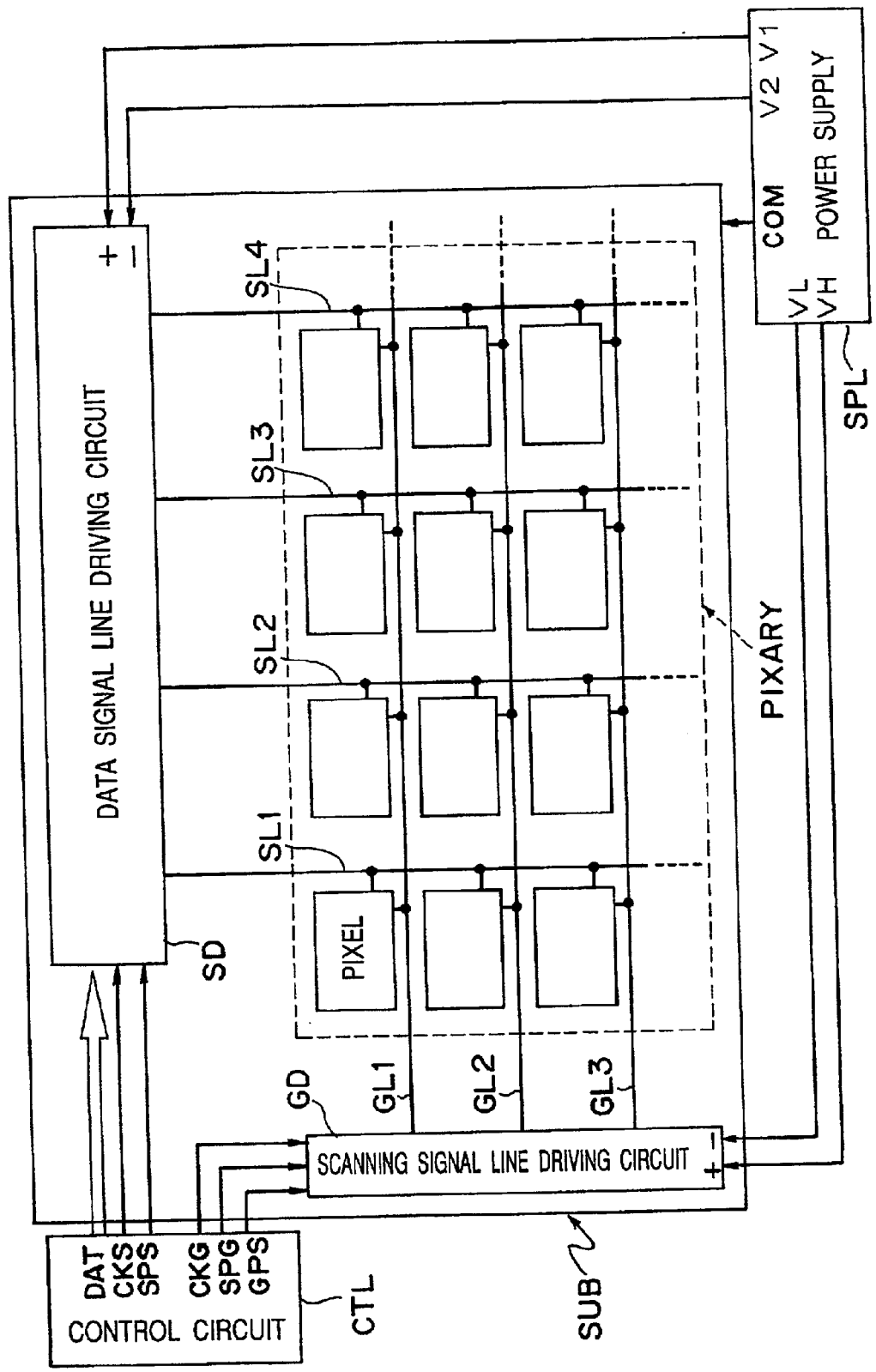
FIG. 9 is a block diagram showing the construction of an image display apparatus according to a seventh embodiment of the present invention.

FIG. 9 schematically shows the construction of an image display apparatus according to a seventh embodiment of the present invention. In the image display apparatus, pixels are arranged in three rows and four columns for the sake of simplicity.

As shown in FIG. 9, the image display apparatus includes a pixel array PIXARY consisting of a plurality of pixels PIX arrayed in the matrix form, a scanning signal line driving circuit GD, a data signal line driving circuit SD, a plurality of scanning signal lines GL1–GL3 extending along rows of pixels PIX, a plurality of data signal lines SL1–SL4 extending along columns of pixels PIX, a control circuit CTL controlling the scanning signal line driving circuit GD and the data signal line driving circuit SD, and a power source circuit SPL supplying reference voltages to the scanning signal line driving circuit GD and to the data signal line driving circuit SD. In the image display apparatus, the pixel array PIXARY, the scanning signal line driving circuit GD, and the data signal line driving circuit SD are formed on an insulative substrate SUB.

The data signal line driving circuit SD samples a digital signal DAT, which is digital image data inputted thereto, in synchronization with timing signals such as a clock signal CKS and a start signal SPS generated by a control signal generator CTL. Then the circuit SD amplifies the sampled digital signal DAT as necessary, and outputs a data signal, which is analog image data, to each of the data signal lines SL1–SL4. The scanning signal line driving circuit GD selects the scanning signal lines GL1–GL3 sequentially in synchronization with a timing signal such as a clock signal CKG generated by the control signal generator CTL to turn on and off switching elements provided in the respective pixels PIX. The data signal outputted to each of the data signal lines SL1–SL4 is thereby written to the pixels PIX. A capacitor provided in each pixel PIX holds the written data signal.

Forming the pixel array PIXARY, the scanning signal line driving circuit GD, and the data signal line driving circuit SD monolithically on the same insulation substrate allows the costs of manufacturing and mounting the scanning signal line driving circuit GD and the data signal line driving circuit SD to be lower than when those driving circuits are formed separately from the pixel array and then assembled together. Also, such a driver monolithic structure reduces the number of connection portions, so that reliability is enhanced.

Figure 10:
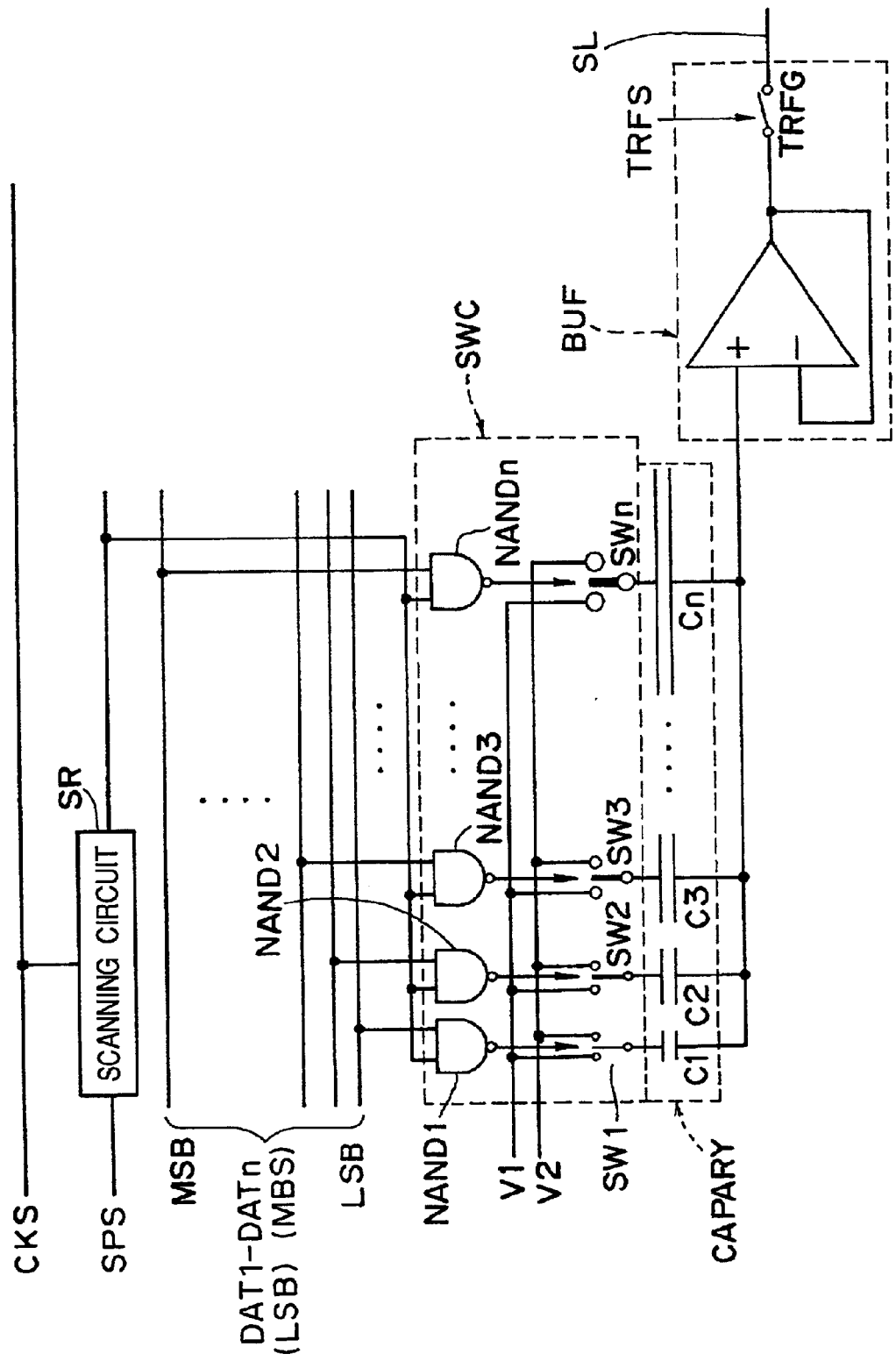
FIG. 10 shows a basic block inside a data signal line driving circuit of the image display apparatus of the present invention.

FIG. 10 shows a fundamental block for one data signal line in the case where the present invention is applied to the data signal line driving circuit of a driver monolithic image display apparatus.

As shown in FIG. 10, for one stage, i.e., for one data signal line SL, the data signal line driving circuit SD includes one scanning circuit SR, a switching circuit SWC performing the switching operation according to the level (high or low) of the input digital signal DAT1–DATn and the output from the scanning circuit SR, a capacitor array CAPARY having capacitors C1–C8 having different areas, namely, different capacitances set at the ratio of $2^0:2^1:2^2:2^3:2^4:2^5:2^6 \ldots 2^{n-1}$ in the order of bit position in the input digital signal from the least significant bit (LSB) to the most significant bit (MSB), and an output circuit BUF outputting a data signal to the corresponding data signal line SL, according to a charge amount held by each of the capacitors C1–Cn of the capacitor array CAPARY. The switching circuit SWC, the capacitor array CAPARY, and the output circuit BUF constitutes a digital-to-analog conversion circuit of charge distribution type.

The switching circuit SWC includes NAND circuits NAND1–NANDn to which an output signal of the scanning circuit SR is inputted through one input terminal thereof and the digital signals DAT1–DATn are inputted through the other input terminal thereof, and switches SW1–SWn whose control input terminals are connected to output terminals of the NAND circuits NAND1–NANDn respectively and whose output terminals are connected to one end of the capacitors C1–Cn respectively. A reference potential V1 for digital-to-analog conversion is connected to one input terminal of each of the switches SW1–SWn. Another reference potential V2 is connected to the other input terminal of each of the switches SW1–SWn.

As shown in FIG. 10, an output of the scanning circuit SR which transfers the start signal SPS sequentially in synchronization with the clock signal CKS supplied from the outside, namely, from the control circuit CTL is used as an enable signal, and the bits of a digital signal DAT1–DATn inputted from the outside in a predetermined period of time synchronously with the clock signal CKS are captured by the analog switches SW1–SWn provided inside the digital-to-analog conversion circuit to change the states of the analog switches SW1–SWn. Thereby a charge distribution is made in the capacitor array having sequentially increasing capacitances, and an output voltage corresponding to the digital signals DAT1–DATn is generated. Thereafter, the output circuit BUF amplifies the obtained voltage and outputs rid it as a data signal to the data signal line SL synchronously with a data signal transfer signal TRFS through a switch TRFG for connecting/disconnecting the output circuit BUF to/from the data signal line SL.

Use of the digital-to-analog conversion circuit of the present invention makes it possible to obtain a high-accuracy data signal line driving circuit having a small area.

Figure 11:
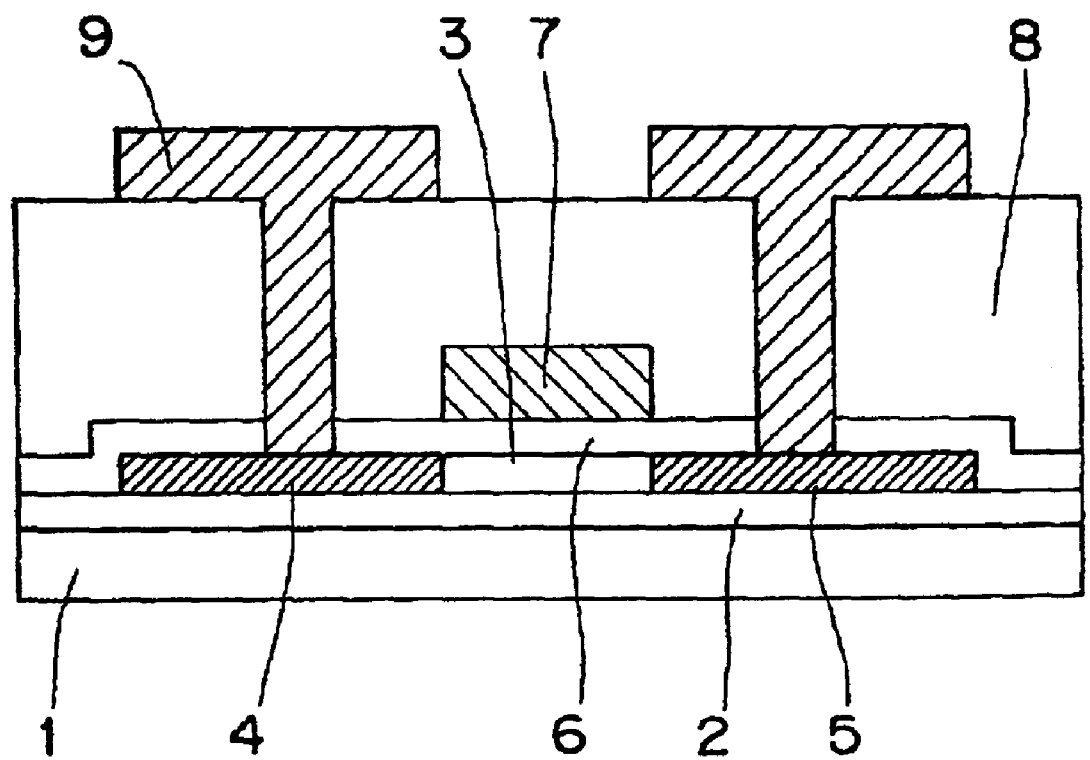
FIG. 11 shows a structure in section of a polycrystalline silicone thin film transistor being a constituent element of the image display apparatus.

FIG. 11 is a sectional view showing the structure of a polycrystalline silicon thin film transistor used in the image display apparatus. As shown in FIG. 11, the polycrystalline silicon thin film transistor includes an insulative substrate 1, a silicone oxide film 2 formed on the insulative substrate 1, a channel region 3, a source region 4, and a drain region 5 of a polycrystalline silicon thin film formed on the silicone oxide film 2, a gate insulation film 6 formed in such a way as to cover the channel region 3, the source region 4, and the drain region 5, a gate electrode 7 formed on the opposite side of the gate insulation film 6 from the channel region 3, an interlaminar insulation film 8 formed on the gate electrode 7 and the gate insulation film 6, and metal wires 9 connected to the source region 4 and the drain region 5. The polycrystalline silicon thin film transistor has a forward stagger (top gate) structure in which the polycrystalline silicone thin film formed on the insulation substrate acts as an active layer. Alternatively, other structures such as a backward stagger structure may be adopted in the present invention.

The use of the polycrystalline silicon thin film transistors allows the scanning signal line driving circuit having a practically sufficient driving capacity, the data signal line driving circuit, and the pixel array to be formed monolithically on the same substrate in almost the same manufacturing process.

FIGS. 12 through 14 are sectional views showing the process of manufacturing the polycrystalline silicon thin film transistor. The process of manufacturing the polycrystalline silicon thin film transistor at a temperature of 600° C. or lower will be described below.

Figure 12A:
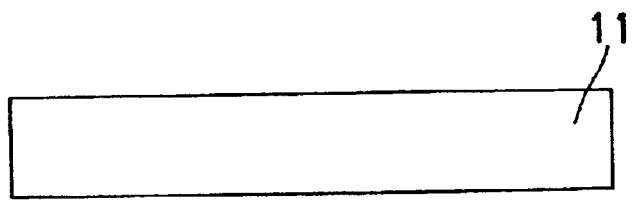
FIGS. 12A, 12B, 12C, 12D, and 12E show an example of a process of manufacturing the polycrystalline silicone thin film transistor.
Figure 12B:
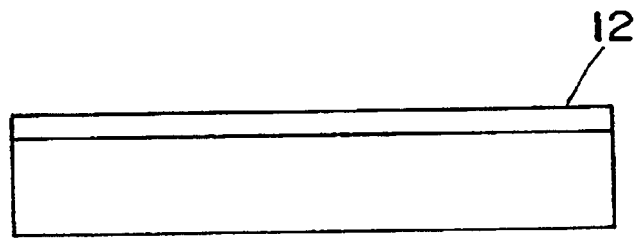

As shown in FIGS. 12A and 12B, an amorphous silicone thin film 12 is deposited on a glass substrate 11.

Figure 12C:
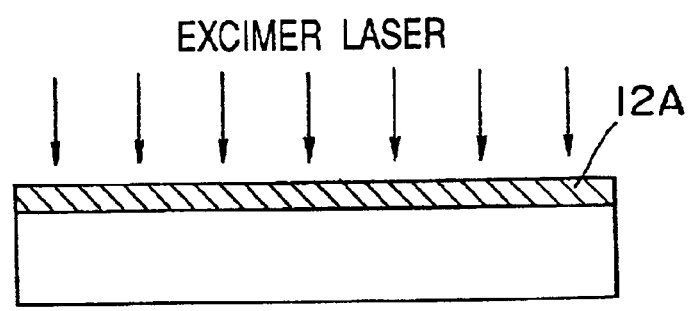

As shown in FIG. 12C, the amorphous silicone thin film 12 is radiated with excimer laser beams to form a polycrystalline silicone thin film 12A.

Figure 12D:
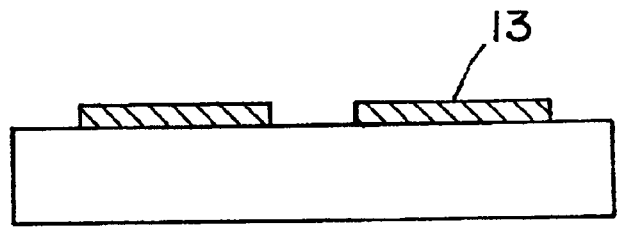

As shown in FIG. 12D, the polycrystalline silicone thin film 12A is patterned in a desired configuration to form polycrystalline silicone regions 13.

Figure 12E:
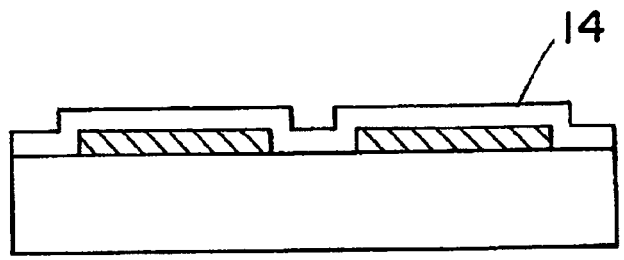

As shown in FIG. 12E, a gate insulation film 14 consisting of silicon dioxide is formed in such a way as to cover the entire substrate or wafer.

Figure 13A:
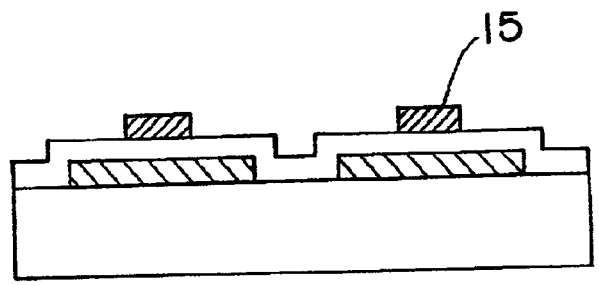
FIGS. 13A, 13B, 13C, and 13D show process steps following the step shown in FIG. 12E.

As shown in FIG. 13A, a gate electrode 15 for a thin film transistor is formed of aluminum or the like on the gate insulation film 14.

Figure 13B:
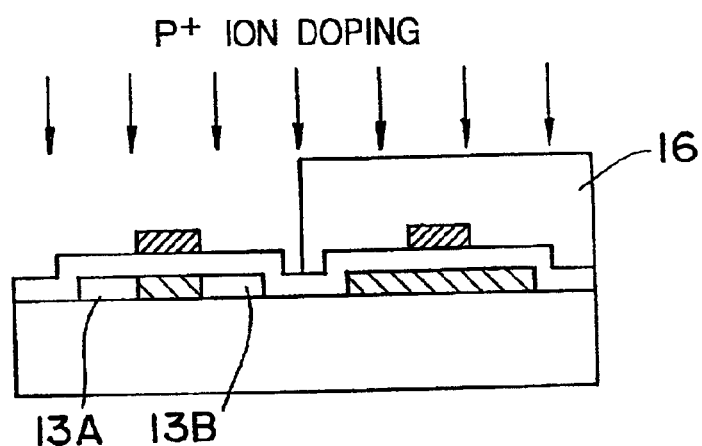

Thereafter, as shown in FIG. 13B, a resist 16 is formed on the right half part, as viewed in the figure, and an impurity (phosphorus for an n-type region) is injected into the polycrystalline silicone region 13 to form a source region 13A and a drain region 13B of the thin film transistor.

Figure 13C:
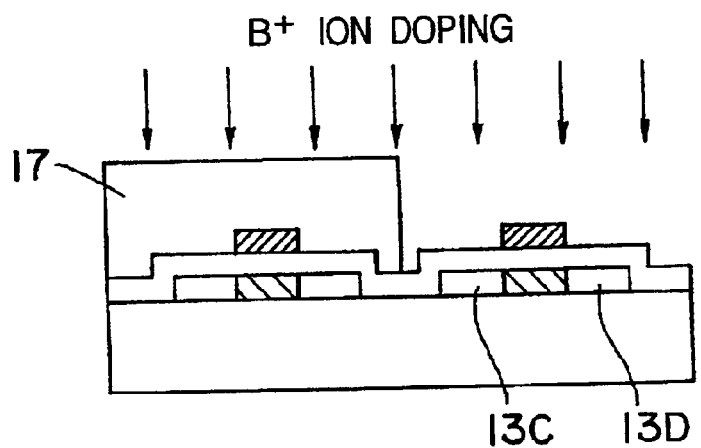

Then, as shown in FIG. 13C, a resist 17 is formed on the left half part as viewed in the figure, and an impurity (boron for a p-type region) is injected into the polycrystalline silicone region 13 to form a source region 13C and a drain region 13D of the thin film transistor.

Figure 13D:
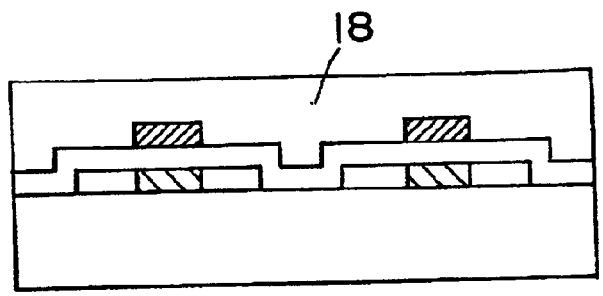

Thereafter, as shown in FIG. 13D, an interlaminar insulation film 10 consisting of silicon dioxide or silicon nitride is formed.

Figure 14A:
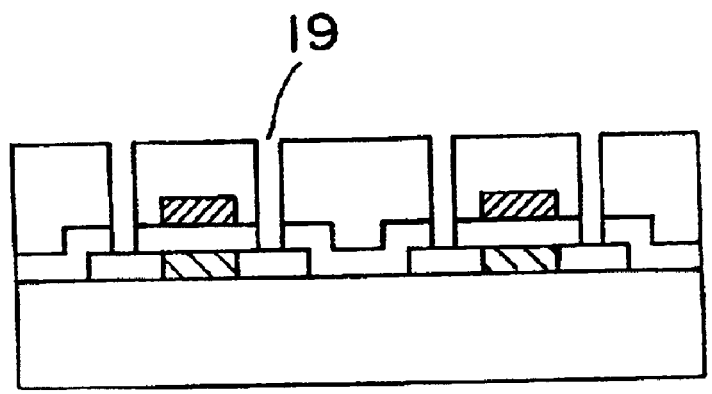
FIGS. 14A and 14B show process steps following the step shown in FIG. 13D.
Figure 14B:
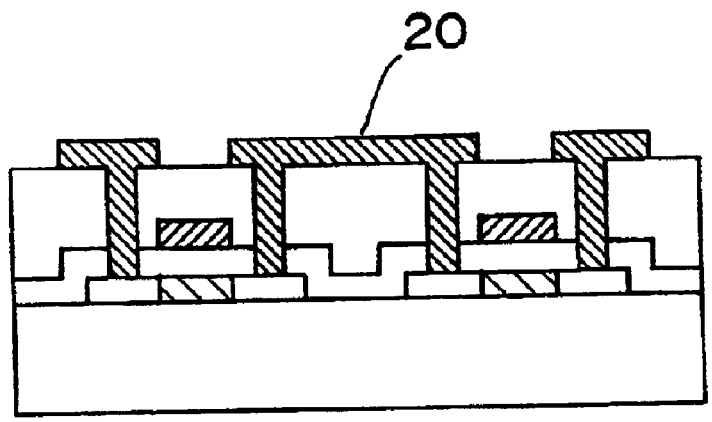

Then, after contact holes 19 are formed through the interlaminar insulation film 18 and the gate insulation film 14 as shown in FIG. 14A, metal wires 20 made of aluminum or the like are formed, as shown in FIG. 14B.

The highest one of the temperatures used in the process steps is 600° C. at which the process of forming the gate insulation film 14 is carried out. Thus as the insulative substrate, highly heat-resistant glass such as 1737 glass manufactured by Corning Inc. of U.S.A. maybe used.

To complete the liquid crystal display device, after the wiring step shown in FIG. 14B, transparent electrodes (for a transmission-type liquid crystal display device) or reflective electrodes (for a reflective-type liquid crystal display device) are formed on another interlaminar insulation film.

In the manufacturing process steps shown in FIGS. 12 to 14, because the polycrystalline silicone thin film transistor is formed at a temperature of 600° C. or lower, an inexpensive glass substrate having a large area can be used. Therefore, it is possible to produce an inexpensive image display apparatus having a large area.

(Eighth Embodiment)

Figure 15:
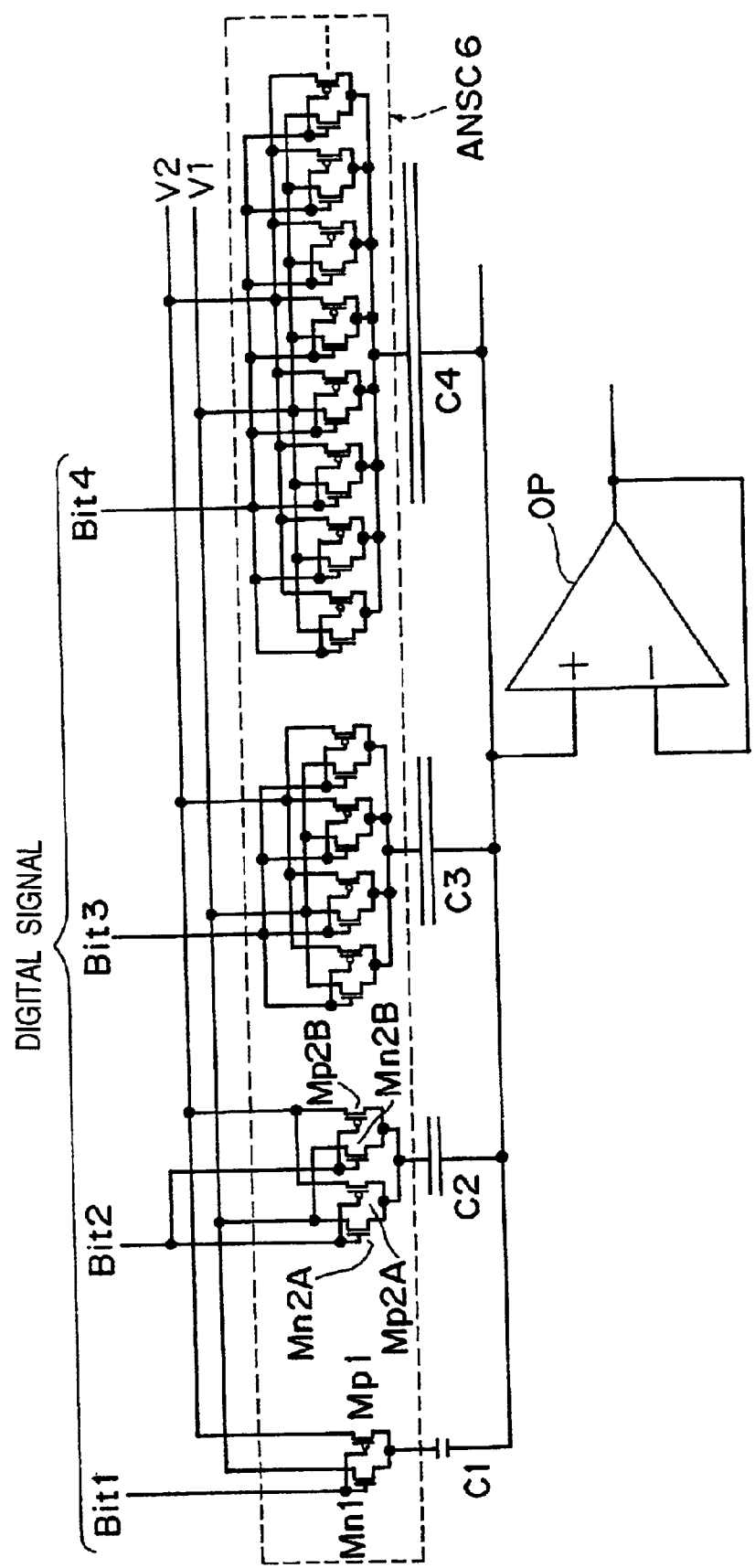
FIG. 15 shows the construction of a digital-to-analog conversion circuit according to an eighth embodiment of the present invention.

FIG. 15 schematically shows the basic construction of a digital-to-analog conversion circuit of charge distribution type according to an eighth embodiment of the present invention.

As shown in FIG. 15, the digital-to-analog conversion circuit includes electric charge distribution capacitors C1, C2, C3, C4 . . . , an analog switch circuit ANSC6 connecting either a reference potential V1 or a reference potential V2 to one end of each of the capacitors C1, C2, C3, C4 . . . , and an operational amplifier OP amplifying a potential at the commonly connected other end of the capacitors C1, C2, C3, C4 . . . and outputting the amplified potential.

The capacitors C1, C2, C3, C4 . . . have their respective capacitances that are varied to increase at the rate of $2^0:2^1:2^2:2^3$ . . . in the increasing order of bit position of the digital signal from the least significant bit Bit1 to the most significant bit Bitn. Thus supposing that the capacitance of the capacitor C1 is CA, the capacitances of the capacitors C2, C3, C4, . . . are 2CA, 4CA, 8CA, . . . respectively.

In the analog switch circuit ANSC6, one N-channel transistor Mn1 of the analog switch corresponding to the least significant bit Bit1 of the digital signal connects/disconnects the one end of the electric charge distribution capacitor C1 to/from the reference potential V1, while one P-channel transistor Mp1 connects/disconnects the one end of the electric charge distribution capacitor C1 to/from the reference potential V2. In the analog switch corresponding to the second least significant bit Bit2 of the digital signal, two N-channel transistors Mn2A and Mn2B connect/disconnect the one end of the electric charge distribution capacitor C2 to/from the reference potential V1, while two P-channel transistors Mp2A and Mp2B connect/disconnect the one end of the electric charge distribution capacitor C2 to/from the reference potential V2. In a similar manner, the number of the N-channel transistors and that of the P-channel transistors increase to 4, 8, . . . respectively for the higher bits Bit3, Bit4 . . . of the digital signal. Digital signals Bit1–Bitn are supplied as they are to the gates of the N-channel transistors Mn1, Mn2A, Mn2B . . . and the P-channel transistors Mp1, Mp2A, Mp2B . . . .

In the digital-to-analog conversion circuit, the gate width of each of the N-channel transistors Mn1, Mn2A, Mn2B, . . . and the P-channel transistors Mp1, Mp2A, Mp2B, . . . are set equal to the gate width of each of the N-channel transistor Mn1 and the P-channel transistor Mp1 for the least significant bit which are to be directly connected to the capacitor having the smallest capacitance. Then, a necessary number of the transistors having an equal gate width are connected in parallel in such a way that the driving capacities of the analog switches corresponding to the respective bits sequentially become higher in the analog switch circuit ANSC6.

Owing to the uniform gate widths of the N-channel transistors Mn1, Mn2A, Mn2B, . . . and the P-channel transistors Mp1, Mp2A, Mp2B, . . . serving as the semiconductor switching elements constituting the analog switch circuit ANSC6, it is possible to uniform influences of a mask shift amount and an etching shift amount caused in the manufacturing process upon the transistors. Consequently, it is possible to prevent the transistors from being varied in the characteristics thereof.

Figure 16:
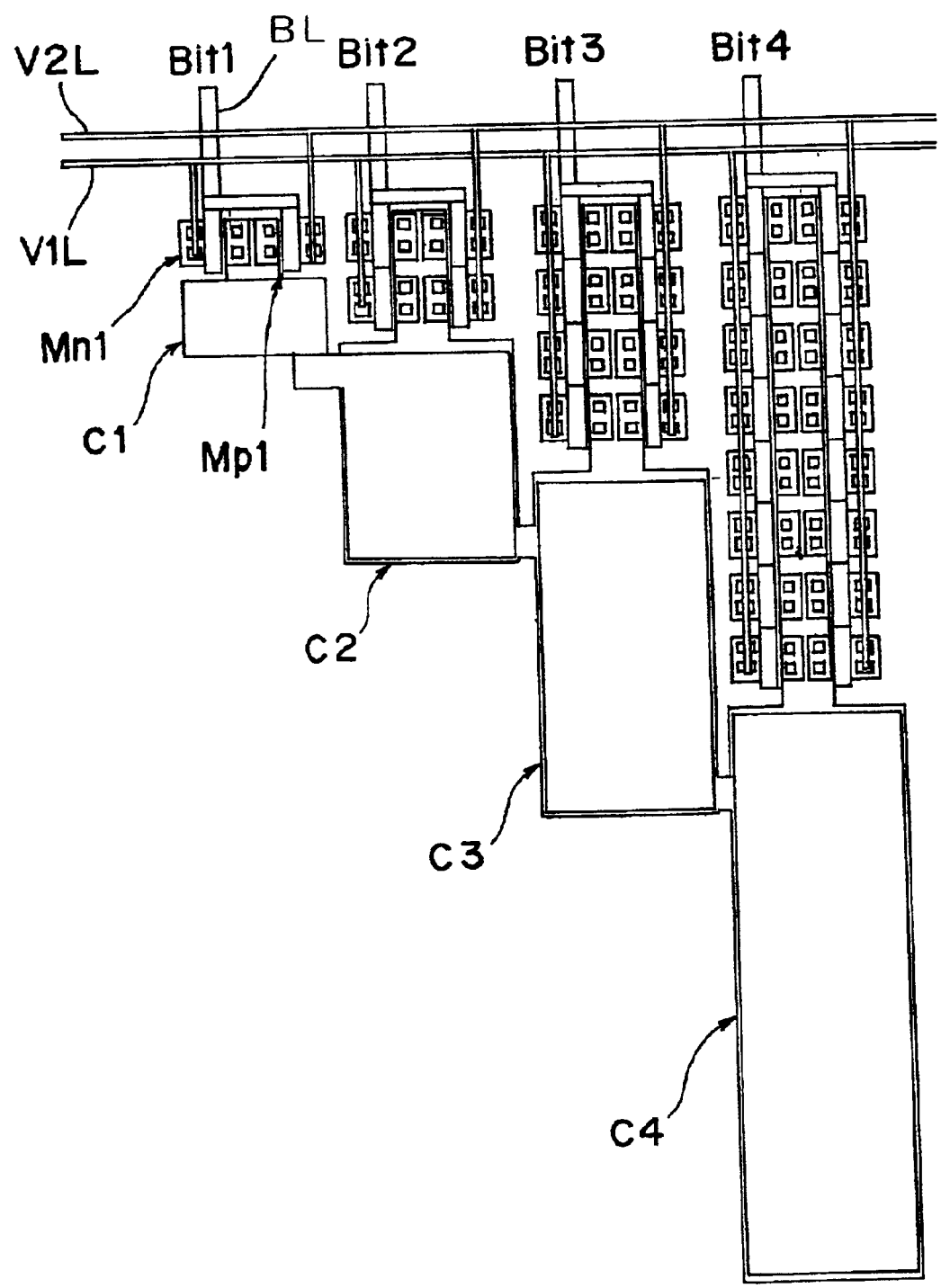
FIG. 16 shows an actual layout of lower four bits in the digital-to-analog conversion circuit.

FIG. 16 shows the layout of the lowest four bits (Bit1–Bit4) in the digital-to-analog conversion circuit of the eighth embodiment. Referring to FIG. 16, reference symbol V1L denotes an electrical wiring for the reference voltage V1, V2L denotes an electrical wiring for the reference voltage V2, and BL denotes an electrical wiring for the digital signal. In the layout, the charge distribution capacitors C1–C4 are each constructed of a dielectric and two different kinds of metal layers sandwiching the dielectric therebetween. The capacitances of the capacitors C1, C2, C3, C4, . . . are adjusted by the areas thereof. The area ratio among the charge distribution capacitors C1, C2, C3, C4, . . . is set to 1:2:4:8 . . . to obtain a capacitance ratio which is the same as the area ratio.

In the eighth embodiment, the construction using the N-channel transistors and the P-channel transistors are used, but other transistor construction may be used. Also, the number of N-channel transistors/P-channel transistors constituting each analog switch is made proportional to the capacitance of the associated capacitor to which the transistors are to be directly connected. Alternatively, the number of the N-channel transistors/P-channel transistors in each analog switch may be determined according to the maximum connection capacitance shown in table 1 or an amount of moving charge obtained by measurement or simulation. In such cases as well, similar effects can be obtained.

(Ninth Embodiment)

Figure 17:
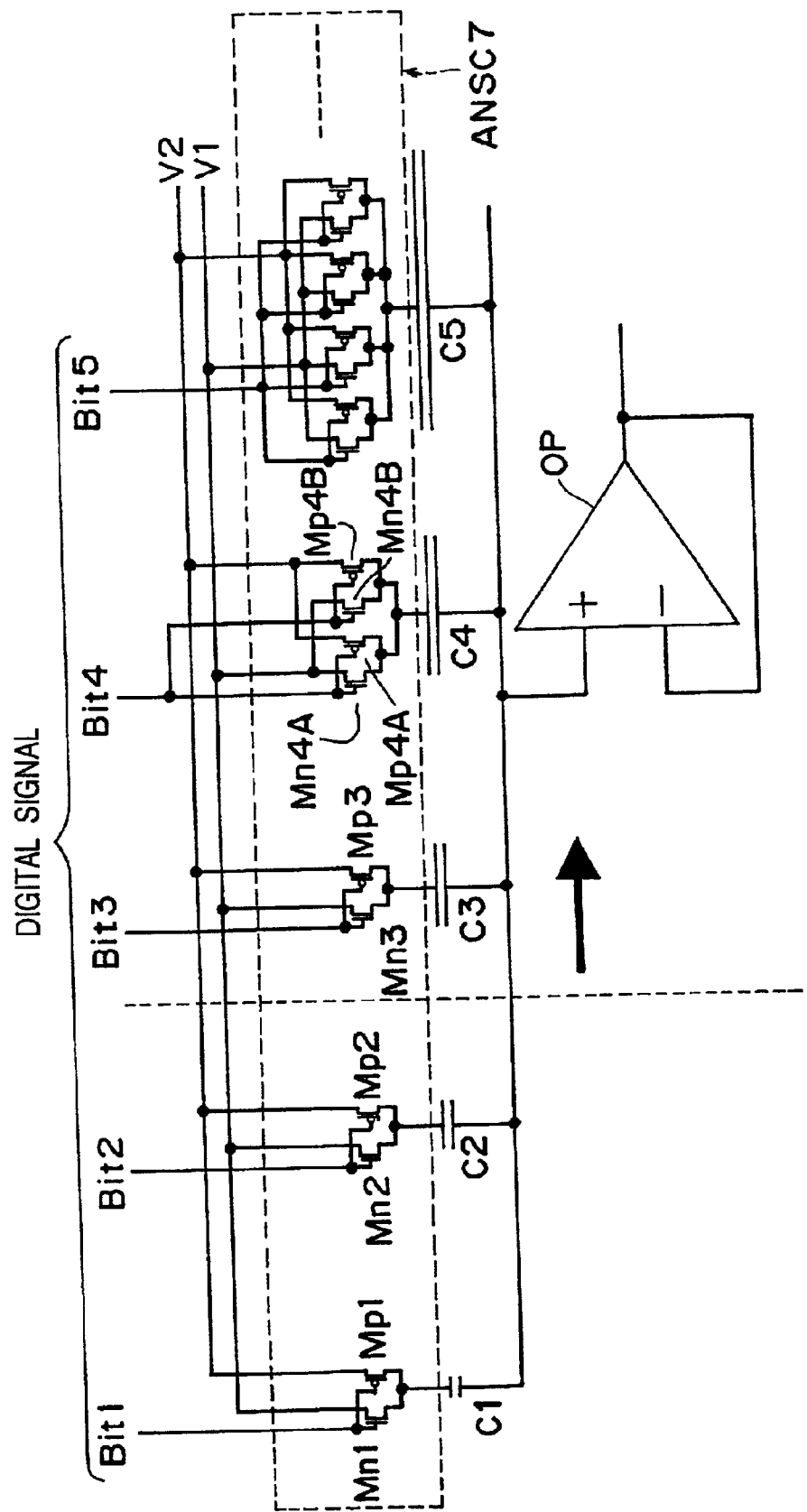
FIG. 17 shows the construction of a digital-to-analog conversion circuit according to a ninth embodiment of the present invention

FIG. 17 schematically shows the basic construction of a digital-to-analog conversion circuit of charge distribution type according to a ninth embodiment of the present invention. In the figure is shown the arrangement of the analog switches in which there is an upper limit to the gate widths of the transistors owing to a factor such as a manufacturing process condition.

As shown in FIG. 17, the digital-to-analog conversion circuit includes electric charge distribution capacitors C1, C2, C3, C4, C5 . . . , an analog switch circuit ANSC7 connecting a reference potential V1 or a reference potential V2 to one end of each of the capacitors C1, C2, C3, C4, C5 . . . , and an operational amplifier OP amplifying a voltage at the commonly connected other end of the capacitors C1, C2, C3, C4, C5 . . . and outputting the amplified voltage.

The capacitors C1, C2, C3, C4, C5 . . . have their respective capacitances that are varied so as to increase at the rate of $2^0:2^1:2^2:2^3$ . . . in the increasing order of bit position of the digital signal from the least significant bit Bit1 to the most significant bit Bitn. Thus supposing that the capacitance of the capacitor C1 is CA, the capacitances of the other capacitors C2, C3, C4, C5 . . . are 2CA, 4CA, 8CA, 16CA . . . respectively.

In the analog switch circuit ANSC7, an N-channel transistor Mn1 of the analog switch corresponding to the bit Bit1 connects/disconnects the one end of the electric charge distribution capacitor C1 to/from the reference potential V1, while a P-channel transistor Mp1 connects/disconnects the one end of the electric charge distribution capacitor C1 to/from the reference potential V2.

In the analog switch corresponding to the bit Bit2, an N-channel transistor Mn2 (whose gate width is twice as large as that of the transistor Mn1) connects/disconnects the one end of the electric charge distribution capacitor C1 to/from the reference potential V1. Also, a P-channel transistor Mp2 (whose gate width is twice as large as that of the transistor Mp1) connects/disconnects the one end of the electric charge distribution.capacitor C1 to/from the reference potential V2.

In the analog switch corresponding to the bit Bit3, an N-channel transistor Mn3 (whose gate width is four times as large as that of the transistor Mn1) connects/disconnects the one end of the electric charge distribution capacitor C1 to/from the reference potential V1. Also, a P-channel transistor Mp3 (whose gate width is four times as large as that of the transistor Mp1) connects/disconnects the one end of the electric charge distribution capacitor C1 to/from the reference potential V2.

In the analog switch corresponding to the bit Bit4, two N-channel transistors Mn4A and Mn4B (whose gate widths are each four times as large as that of the transistor Mn1) connect/disconnect the one end of the electric charge distribution capacitor C1 to/from the reference potential V1. On the other hand, two P-channel transistors Mp4A and Mp4B (whose gate widths are each four times as large as that of the transistor Mp1) connect/disconnect the one end of the electric charge distribution capacitor C1 to/from the reference potential V2. In a similar manner, the number of the N-channel transistors and the number of the P-channel transistors are doubled every bit of the digital signal in the following analog switches. Digital signals Bit1, Bit2, Bit3, Bit4, Bit5 . . . are supplied to the gate of each of the N-channel transistors Mn1, Mn2, Mn3, Mn4A, Mn4B . . . and the P-channel transistors Mp1, Mp2, Mp3, Mp4A, Mp4B . . . .

The driving capacities of the analog switches are increased by sequentially varying the gate widths of the semiconductor transistors constituting the analog switches until the gate widths of the transistors reach a predetermined size (i.e., four times as large as the gate widths of the transistors Mn1, Mp1). In each analog switch which is W1 required to have a driving capacity which would be provided by a transistor having a gate width larger than the predetermined gate width, the driving capacity is increased sequentially by connecting a sequentially increasing number of transistors having the predetermined gate width in parallel.

In the analog switches corresponding to Bit4 and the higher-order bits of the digital signal, owing to the uniform gate widths of the parallel-connected N-channel transistors Mn4A, Mn4B . . . and the parallel-connected P-channel transistors Mp4A, Mp4B . . . , it is possible to make uniform the influence of a mask shift amount and an etching shift amount, which take place in the manufacturing process, on the transistors. Consequently, it is possible to prevent the transistors from being varied in the characteristics.

In the ninth embodiment, the N-channel transistors and the P-channel transistors are used in combination, but other transistor arrangements may be used. In the analog switches corresponding to the bit Bit4 and the following bits, the number of the N-channel transistors and that of the P-channel transistors are proportional to the capacitance of the corresponding capacitor to which the transistors are directly or immediately connected. That is, the ratio of the numbers of transistors in the analog switches corresponds to the ratio of the capacitances of the corresponding capacitors. Alternatively, the ratio of the numbers of transistors in the analog switches may be determined according to the ratio of the maximum connection capacitances shown in Table 1 or the amounts of moving charge found by measurement or simulation. In these cases as well, similar effects can be obtained.

The present invention is not limited to the constructions of the described embodiments. Needless to say, the present invention is applicable to other constructions such as combinations of the constructions of the embodiments in respects including the number of signals, the kind thereof, the polarity thereof, and the like.

As apparent from the foregoing description, according to the digital-to-analog conversion circuit of the present invention, the analog switches are given their respective driving capacities that are increased according to the maximum connection capacities corresponding to the individual analog switches or according to required driving capacities estimated in consideration of on-state resistances of transistors, parasitic capacitances existing on the layout, and the like. Therefore, for each analog switch, it is possible to minimize the difference between an actually set driving capacity and an optimum driving capacity determined from a charging direction, a charging time and a layout area for each charge distribution capacitor. Thus, a digital-to-analog conversion circuit having higher accuracy and a smaller area than the conventional digital-to-analog conversion circuit is achieved. The advantage of the present invention is displayed more effectively in a digital-to-analog conversion circuit intended for a multi-bit digital signal in which there is a big difference in capacitance between a capacitor for a lower bit and a capacitor for a higher bit.

Also, by using the digital-to-analog conversion circuit of the present invention for an image display apparatus, such as a liquid crystal display, of a portable terminal equipment, it is possible to reduce the size of the image display apparatus, namely, to allow the frame thereof to be small without reducing its display region. Therefore, a compact and high-quality image display apparatus is achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A digital-to-analog conversion circuit of charge distribution type comprising:

a plurality of capacitors having respective capacitances that increase in a sequential order, one end of the capacitors being commonly connected electrically;

a plurality of analog switches each for selectively, electrically connecting one of first and second reference potentials corresponding to a digital signal inputted from outside to the other end of a corresponding capacitor, the digital-to-analog conversion circuit outputting an analog signal corresponding to a potential at the commonly connected one end of the capacitors, wherein the plurality of analog switches have respective driving capacities that increase in a sequential order, and wherein the driving capacity of each analog switch is set according to a maximum connection capacitance of the analog switch, namely a combined capacitance of the plurality of capacitors to be obtained in a state in which only the analog switch is connected to one of the first and second reference potentials with the remaining analog switch or switches being connected to the other of the first and second reference potentials such that a ratio of the driving capacities of the plurality of analog switches is equal to a ratio of the corresponding combined capacitances.

2. The digital-to-analog conversion circuit according to claim 1, wherein each of said analog switches comprises at least one of an N-channel transistor or a P-channel transistor.

3. The digital-to-analog conversion circuit according to claim 1, wherein the driving capacity of each analog switch is established so as to minimize a difference between the established driving capacity and an optimum driving capacity for charging of the corresponding capacitor.

4. The digital-to-analog conversion circuit according to claim 1, wherein the driving capacity of each analog switch is set according to a size of the one of the plurality of capacitors connected to said each switch.

5. The digital-to-analog conversion circuit according to claim 1, wherein the driving capacity of each analog switch is set so the time period for charging each of the plurality of capacitors is substantially uniform.

6. A digital-to-analog conversion circuit of charge distribution type comprising:

a plurality of capacitors having respective capacitances that increase in a sequential order, one end of the capacitors being commonly connected electrically; and a plurality of analog switches each for selectively, electrically connecting one of first and second reference potentials corresponding to a digital signal inputted from outside to the other end of a corresponding capacitor, the digital-to-analog conversion circuit outputting an analog signal corresponding to a potential at the commonly connected one end of the capacitors, wherein the plurality of analog switches have respective driving capacities that increase in a sequential order, wherein the driving capacity of each analog switch is set according to a maximum connection capacitance of the analog switch, namely a combined capacitance of the plurality of capacitors to be obtained in a state in which only the analog switch is connected to one of the first and second reference potentials with the remaining analog switch or switches being connected to the other of the fist and second reference potentials such that a ratio of the driving capacities of the plurality of analog switches is equal to a ratio of the corresponding combined capacitance, wherein each of said analog switches comprises at least one of an N-channel transistor or a P-channel transistor; and wherein gate width of the said at least one of the N-channel or P-channel transistors of said each analog switch is set depending on the corresponding combined capacitance.

7. A digital-to-analog conversion circuit of charge distribution type comprising:

a plurality of capacitors having respective capacitances that increase in a sequential order, one end of the capacitors being commonly connected electrically; and a plurality of analog switches each for selectively, electrically connecting one of first and second reference potentials corresponding to a digital signal inputted from outside to the other end of a corresponding capacitor, the digital-to-analog conversion circuit outputting an analog signal corresponding to a potential at the commonly connected one end of the capacitors, wherein the plurality of analog switches have respective driving capacities that increase in a sequential order, wherein the driving capacity of each analog switch is set according to a maximum connection capacitance of the analog switch, namely a combined capacitance of the plurality of capacitors to be obtained in a state in which only the analog switch is connected to one of the first and second reference potentials with the remaining analog switch or switches being connected to the other of the first and second reference potentials such that a ratio of the driving capacities of the plurality of analog switches is equal to a ratio of the corresponding combined capacitance, and wherein each of the analog switches consists of a single semiconductor switching element or a plurality of parallel-connected semiconductor switching elements, the plurality of semiconductor switching elements of the analog switches having a substantially same driving capacity, such that the analog switches have their respective driving capacities.

8. The digital-to-analog conversion circuit according to claim 7, wherein each semiconductor switching element comprises at least one of an N-channel transistor or a P-channel transistor, the transistors of the semiconductor switching elements having a substantially same gate width.

9. A digital-to-analog conversion circuit of charge distribution type comprising:

a plurality of capacitors having respective capacitances that increase in a sequential order, one end of the capacitors being commonly connected electrically; and a plurality of analog switches each for selectively, electrically connecting one of first and second reference potentials corresponding to a digital signal inputted from outside to the other end of a corresponding capacitor, the digital-to-analog conversion circuit outputting an analog signal corresponding to a potential at the commonly connected one end of the capacitors, wherein the plurality of analog switches have respective driving capacities that increase in sequential order, wherein the driving capacity of each analog switch is set according to a maximum connection capacitance of the analog switch, namely a combined capacitance of the plurality of capacitors to be obtained in a state in which only the analog switch is connected to one of the first and second reference potentials with the remaining analog switch or switches being connected to the other of the first and second reference potentials such that a ratio of the driving capacities of the plurality of analog switches is equal to a ratio of the corresponding combined capacitance, each of the analog switches whose respective driving capacities are not more than a predetermined value has a single semiconductor switching element, the semiconductor switching elements of the analog switches having respective driving capacities different from each other; and each of the analog switches whose respective driving capacities are more than the predetermined value has a plurality of parallel-connected semiconductor switching elements whose driving capacities are substantially the same and not more than the predetermined value.

10. The digital-to-analog conversion circuit according to claim 9, wherein each semiconductor switching element comprises at least one of an N-channel transistor or a P-channel transistor, and a driving capacity of each transistor is set by a gate width thereof.

11. An image display apparatus comprising:

a plurality of pixels arrayed in a matrix form;

a plurality of data signal lines extending along columns of the pixels;

a plurality of scanning signal lines extending along rows of the pixels;

a data signal line driving circuit supplying analog image data corresponding to digital image data to the data signal lines; and a scanning signal line driving circuit supplying a scanning signal to the scanning signal lines, wherein said data signal line driving circuit comprises a digital-to-analog conversion circuit, said digital-to-analog conversion circuit including:
- a plurality of capacitors having respective capacitances that increase in a sequential order, one end of the capacitors being commonly connected electrically,
- a plurality of analog switches each for selectively, electrically connecting one of first and second reference potentials corresponding to a digital signal inputted from outside to the other end of a corresponding capacitor,
- the digital-to-analog conversion circuit outputting an analog signal corresponding to a potential at the commonly connected one end of the capacitors,
- wherein the plurality of analog switches have respective driving capacities that increase in a sequential order, and
- wherein the driving capacity of each analog switch is set according to a maximum connection capacitance of the analog switch, namely a combined capacitance of the plurality of capacitors to be obtained in a state in which only the analog switch is connected to one of the first and second reference potentials with the remaining analog switch or switches being connected to the other of the first and second reference potentials such that a ratio of the driving capacities of the plurality of analog switches is equal to a ratio of the corresponding combined capacitance.

12. The image display apparatus according to claim 11, wherein the data signal line driving circuit, the scanning signal line driving circuit, and the pixels are formed on a single substrate.

13. The image display apparatus according to claim 12, wherein active elements included in the data signal line driving circuit, the scanning signal line driving circuit, and the pixels comprise polycrystalline silicone thin film transistors.

14. The image display apparatus according to claim 13, wherein said substrate is a glass substrate and the polycrystalline silicone thin film transistors have been formed on the glass substrate in a manufacturing process using a temperature of 600° C. or lower.

15. An image display apparatus comprising:
- a plurality of pixels arrayed in a matrix form;
- a plurality of data signal lines extending along columns of the pixels;
- a plurality of scanning signal lines extending along rows of the pixels;
- a data signal line driving circuit supplying analog image data corresponding to digital image data to the data signal lines; and
- a scanning signal line driving circuit supplying a scanning signal to the scanning signal lines,
- wherein said data signal line driving circuit comprises a digital-to-analog conversion circuit, said digital-to-analog conversion circuit including:
  - a plurality of capacitors having respective capacitances that increase in a sequential order, one end of the capacitors being commonly connected electrically;
  - a plurality of analog switches each for selectively, electrically connecting one of first and second reference potentials corresponding to a digital signal inputted from outside to the other end of a corresponding capacitor,
  - the digital-to-analog conversion circuit outputting an analog signal corresponding to a potential at the commonly connected one end of the capacitors,
  - wherein the plurality of analog switches have respective driving capacities that increase in sequential order,
  - wherein the driving capacity of each analog switch is set according to a maximum connection capacitance of the analog switch, namely a combined capacitance of the plurality of capacitors to be obtained in a state in which only the analog switch is connected to one of the first and second reference potentials with the remaining analog switch or switches being connected to the other of the first and second reference potentials such that a ratio of the driving capacities of the plurality of analog switches is equal to a ratio of the corresponding combined capacitance,
  - wherein each of said analog switches comprises at least one of an N-channel transistor or a P-channel transistor, and
  - wherein gate width of the said at least one of the N-channel or P-channel transistors of said each analog switch is set depending on the corresponding combined capacitance.

16. The image display apparatus according to claim 15, wherein the data signal line driving circuit, the scanning signal line driving circuit, and the pixels are formed on a single substrate.

17. The image display apparatus according to claim 16, wherein active elements included in the data signal line driving circuit, the scanning signal line driving circuit, and the pixels comprise polycrystalline silicone thin film transistors.

18. The image display apparatus according to claim 17, wherein said substrate is a glass substrate and the polycrystalline silicone thin film transistors have been formed on the glass substrate in a manufacturing process using a temperature of 600° C. or lower.

19. An image display apparatus comprising:
- a plurality of pixels arrayed in a matrix form;
- a plurality of data signal lines extending along columns of the pixels;
- a plurality of scanning signal lines extending along rows of the pixels;
- a data signal line driving circuit supplying analog image data corresponding to digital image data to the data signal lines; and
- a scanning signal line driving circuit supplying a scanning signal to the scanning signal lines,
- wherein said data signal line driving circuit comprises a digital-to-analog conversion circuit, said digital-to-analog circuit including:
  - a plurality of capacitors having respective capacitances that increase in a sequential order, one end of the capacitors being commonly connected electrically,
  - a plurality of analog switches each for selectively, electrically connecting one of first and second reference potentials corresponding to a digital signal inputted from outside to the other end of a corresponding capacitor,
  - the digital-to-analog conversion circuit outputting an analog signal corresponding to a potential at the commonly connected one end of the capacitors,
  - wherein the plurality of analog switches have respective driving capacities that increase in sequential order,
  - wherein the driving capacity of each analog switch is set according to a maximum connection capacitance of the analog switch namely a combined capacitance of the plurality of capacitors to be obtained in a state in which only the analog switch is connected to one of the first and second reference potentials with the remaining analog switch or switches being connected to the other of the first and second reference potentials such that a ratio of the driving capacities of the plurality of analog switches is equal to a ratio of the corresponding combined capacitance, and wherein each of the analog switches consists of a single semiconductor switching element or a plurality of parallel-connected semiconductor switching elements, the plurality of semiconductor switching elements of the analog switches having a substantially same driving capacity, such that the analog switches have their respective driving capacities.

20. The image display apparatus according to claim 19, wherein the data signal line driving circuit, the scanning signal line driving circuit, and the pixels are formed on a single substrate.

21. The image display apparatus according to claim 20, wherein active elements included in the data signal line driving circuit, the scanning signal line driving circuit, and the pixels comprise polycrystalline silicone thin film transistors.

22. The image display apparatus according to claim 21, wherein said substrate is a glass substrate and the polycrystalline silicone thin film transistors have been formed on the glass substrate in a manufacturing process using a temperature of 600° C. or lower.

23. An image display apparatus comprising:

a plurality of pixels arrayed in a matrix form;

a plurality of data signal lines extending along columns of the pixels;

a plurality of scanning signal lines extending along rows of the pixels;

a data signal line driving circuit supplying analog image data corresponding to digital image data to the data signal lines; and a scanning signal line driving circuit supplying a scanning signal to the scanning signal lines, wherein said data signal line driving circuit comprises a digital-to-analog conversion circuit, said digital-to-analog circuit including:

a plurality of capacitors having respective capacitances that increase in a sequential order, one end of the capacitors being commonly connected electrically, a plurality of analog switches each for selectively, electrically connecting one of first and second reference potentials corresponding to a digital signal inputted from outside to the other end of a corresponding capacitor, the digital-to-analog conversion circuit outputting an analog signal corresponding to a potential at the commonly connected one end of the capacitors, wherein the plurality of analog switches have respective driving capacities that increase in sequential order, wherein the driving capacity of each analog switch is set according to a maximum connection capacitance of the analog switch, namely a combined capacitance of the plurality of capacitors to be obtained in a state in which only the analog switch is connected to one of the first and second reference potentials with the remaining analog switch or switches being connected to the other of the first and second reference potentials such that a ratio of the driving capacities of the plurality of analog switches is equal to a ratio of the corresponding combined capacitance, each of the analog switches whose respective driving capacities are not more than a predetermined value has a single semiconductor switching element, the semiconductor switching elements of the analog switches having respective driving capacities different from each other, and each of the analog switches whose respective driving capacities are more than the predetermined value has a plurality of parallel-connected semiconductor switching elements whose driving capacities are substantially the same and not more than the predetermined value.

24. The image display apparatus according to claim 23, wherein the data signal line driving circuit, the scanning signal line driving circuit, and the pixels are formed on a single substrate.

25. The image display apparatus according to claim 24, wherein active elements included in the data signal line driving circuit, the scanning signal line driving circuit, and the pixels comprise polycrystalline silicone thin film transistors.

26. The image display apparatus according to claim 25, wherein said substrate is a glass substrate and the polycrystalline silicone thin film transistors have been formed on the glass substrate in a manufacturing process using a temperature of 600° C. or lower.

* * * * *